(12) United States Patent
Miller et al.

(10) Patent No.: US 8,465,996 B2
(45) Date of Patent: Jun. 18, 2013

(54) SURFACE TREATMENT TO IMPROVE RESISTIVE-SWITCHING CHARACTERISTICS

(75) Inventors: Michael Miller, San Jose, CA (US); Prashant Phatak, San Jose, CA (US); Tony Chiang, Campbell, CA (US); Xiyang Chen, San Jose, CA (US); April Schricker, Palo Alto, CA (US); Tanmay Kumar, Milpitas, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/593,116

(22) Filed: Aug. 23, 2012

(65) Prior Publication Data

US 2012/0315725 A1 Dec. 13, 2012

Related U.S. Application Data

(63) Continuation of application No. 13/252,360, filed on Oct. 4, 2011, now Pat. No. 8,274,066.

(51) Int. Cl.
*H01L 21/00* (2006.01)

(52) U.S. Cl.
USPC .......................... 438/45; 257/4; 257/E45.003

(58) Field of Classification Search
USPC .................... 257/2–5; 438/45, 385, 466–468, 438/506, 511, 514, 517, 518
See application file for complete search history.

(56) References Cited

U.S. PATENT DOCUMENTS

| | | | |
|---|---|---|---|
| 7,501,320 B2 * | 3/2009 | Park et al. ..................... | 438/238 |
| 2004/0161888 A1 * | 8/2004 | Rinerson et al. ............... | 438/210 |
| 2006/0281218 A1 * | 12/2006 | Chen ............................. | 438/102 |
| 2007/0228427 A1 * | 10/2007 | Matsui et al. .................. | 257/288 |
| 2010/0200852 A1 * | 8/2010 | Kawashima et al. ........... | 257/43 |
| 2010/0237317 A1 * | 9/2010 | Tsunoda ......................... | 257/4 |

\* cited by examiner

*Primary Examiner* — Julio J Maldonado
*Assistant Examiner* — Sonya D McCall Shepard

(57) ABSTRACT

This disclosure provides a method of fabricating a semiconductor device layer and associated memory cell structures. By performing a surface treatment process (such as ion bombardment) of a semiconductor device layer to create defects having a deliberate depth profile, one may create multistable memory cells having more consistent electrical parameters. For example, in a resistive-switching memory cell, one may obtain a tighter distribution of set and reset voltages and lower forming voltage, leading to improved device yield and reliability. In at least one embodiment, the depth profile is selected to modulate the type of defects and their influence on electrical properties of a bombarded metal oxide layer and to enhance uniform defect distribution.

20 Claims, 22 Drawing Sheets

US 8,465,996 B2

SURFACE TREATMENT TO IMPROVE RESISTIVE-SWITCHING CHARACTERISTICS

CROSS-REFERENCE TO RELATED APPLICATION

This application is a continuation application and claims priority to of U.S. application Ser. No. 13/252,360 filed on Oct. 4, 2011, which is a divisional application and claims priority to U.S. application Ser. No. 12/345,576 filed on Dec. 29, 2008, issued as U.S. Pat. No. 8,062,918, both of which are hereby incorporated by reference in their entirety for all purposes. U.S. application Ser. No. 12/345,576 claims the benefit of U.S. Provisional Application No. 61/049,752, filed on May 1, 2008 and U.S. Provisional Application No. 61/052,174, filed on May 10, 2008, both of which are hereby incorporated by reference in their entireties for all purposes.

BACKGROUND

In recent years, flash memory has become the most common form of non-volatile memory, mostly because it permits high density of memory cells, maintains low manufacturing cost and is generally reliable as a form of secondary storage. Conventional flash memory, however, suffers from a defect in that it degrades the more often it is reprogrammed, a disadvantage that grows more prominent as memory density continues to increase. Additionally, conventional flash memory operates too slowly to be used as a general substitute for random access memory (RAM).

Industry has therefore searched for other non-volatile alternatives to flash memory; some proposed devices are based on memory cells that are controlled to change their effective resistance, and thereby store information. These devices generally have not yet been widely commercialized owing to silicon processing variations (a) that cause some cells to fail, such that they cannot be properly set or reset and (b) that, for those cells which do not fail, create unacceptable variation in the stimuli needed to form (i.e., condition), set and reset those cells.

What is needed are non-volatile devices and structures that exhibit greater consistency in terms of their characteristics, as well as methods for making these devices. The present invention addresses these needs and provides further, related advantages.

BRIEF DESCRIPTION OF THE DRAWINGS

FIG. 3 shows an electrode 305 and semiconductor device layer 307 that have each been deposited above a substrate 303. Although not depicted by FIG. 3, additional "optional" layers may also be deposited in between any of these layers, as desired for the particular implementation.

FIG. 4 uses a series of arrows 413 to depict ions that have been directed with a specific amount of energy at the surface of a deposited semiconductor device layer. As indicated by a normal distribution form 409 at the left-hand side of FIG. 4, the ion implantation process is controlled so as to distribute ions within the semiconductor device layer in a carefully controlled manner (e.g., in a probabilistic fashion about a desired mean depth). That is to say, by controlling both dose and energy, one may tune the concentration of defects to desired levels. A dashed line 411 is used to denote that, in at least some embodiments, ions may be distributed primarily in an "upper-half" of the semiconductor device layer, for the purpose of deliberately creating defects (e.g., vacancies, interstitials, and substitutional defects) in the upper half of the layer. The bombardment process may be used to help ensure a consistent density of these defects in the plane of the semiconductor device layer, denoted by arrows 415 and extending orthogonally to the page.

FIG. 5 illustrates that the post-bombardment semiconductor device layer has been effectively separated into a first region 509, where ions have effectively created various defects in a controlled manner, and a second region 511, where the semiconductor material remains substantially unaltered by the implant process.

FIG. 9 helps show that defect enhancement using the principles set forth by this disclosure can help substantially reduce forming voltage needed to condition the device for first use.

FIG. 10 shows that the sample with more consistent defects demonstrates greater reliability and that failure, when it does occur, tends to happen later.

FIG. 12 is used to present an example of how ion bombardment parameters may be varied so as to specifically tailor the concentration of ions (and associated defects) and their depth of penetration.

FIG. 18 shows curves 1803 and 1807 associated with a bistable memory device, showing each of a high resistance state and low resistance state, respectively.

FIG. 19 is used to compare an Ohmic response 1903 with a non-linear response 1907 (the latter being desired for operation of a multistable memory device).

DETAILED DESCRIPTION

Figure 1:
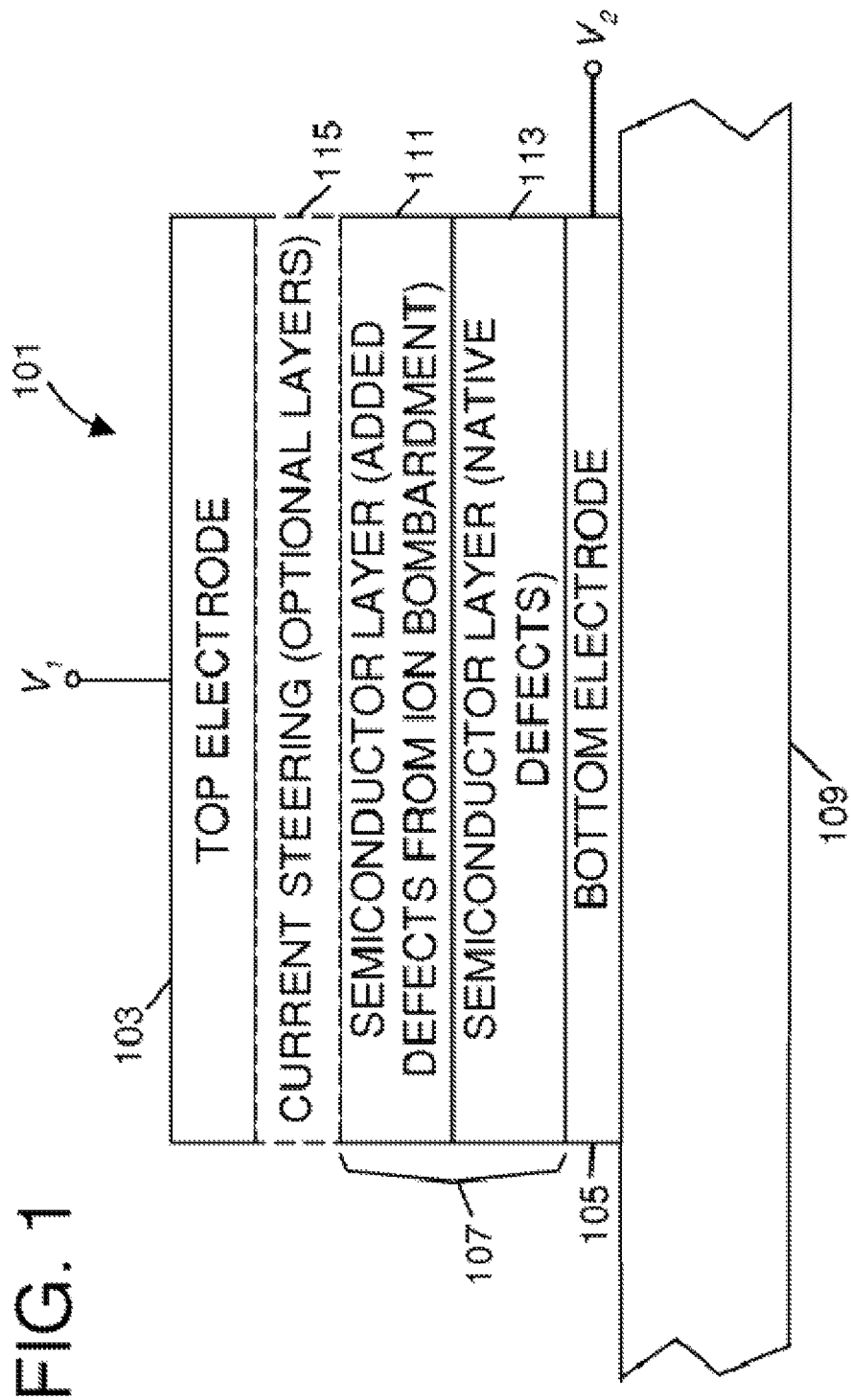
FIG. 1 is a cross-sectional diagram of a memory cell 101; the memory cell includes top and bottom electrodes 103 and 105, with a semiconductor device layer 107 therebetween, all mounted above a substrate 109. The semiconductor device layer includes a first region 111 that has been doped via ion implantation to create various defects to enhance multistable properties associated with the memory cell. These defects can be atomic vacancies created by atomic collisions with in-bound implanted ions, interstitial defects created by the generation of these atomic vacancies, interstitial defects generated by implanted ions that did not substitute into the atomic lattice, and/or ions that have been come to rest in a place that would usually by occupied by one of the atoms in the lattice (substitutional defects).

The invention defined by the enumerated claims may be better understood by referring to the following detailed description, which should be read in conjunction with the accompanying drawings. This description of one or more particular embodiments, set out below to enable one to build and use various implementations of the invention or inventions set forth by the claims, is not intended to limit the enumerated claims, but to exemplify their application to certain methods and devices. The description set out below exemplifies (i) a method of fabricating a semiconductor device layer, namely, one that used ion doping and defect creation to improve device properties, and (ii) a device based on such a method, implemented for example as a memory device that is controlled to change resistive state and thus store information. The invention, however, may also be applied to other methods and devices as well.

I. Overview

As exemplified by the accompanying FIGS., the present disclosure provides an improved semiconductor device layer suitable for use in a memory device based upon controlled change of resistance, and a method for making such a layer. More specifically, a surface treatment process may be used to create various defects in a semiconductor device layer in a predictable, controlled manner. These added defects, in turn, provide for better, tighter control over forming, set and reset voltages in multistable resistive memory devices, and thus lead to greater yield and more predictable operation. That is to say, the purpose of surface treatment is not to use ions to form conductive metal filaments, but rather to control the formation of defects within a semiconductor device layer so as to achieve both tighter tolerances associated with mechanisms that engender resistive state change and changes in the population, localization and qualities of the defects associated with mechanisms that engender resistive state change.

One method presented below, exemplified by FIGS. 2-6, involves ion bombardment of a semiconductor device layer (e.g., a metallic oxide layer) to create these defects. The semiconductor layer is typically formed to be a crystalline or amorphous structure that will have a somewhat unpredictable, non-uniform and unrepeatable distribution of inherent defects. That is to say, it is believed these defects are associated with resistive state change, and that unpredictable distribution of these defects contributes in part to memory cells that either fail to set or reset, or that have undesirable variability in current or voltage needed to control or read those memory cells. Through better control over defect distribution and depth, for example, by using a surface treatment process to create additional defects in a controlled manner, over and above native defects already existing in the material, it is believed that more predicable memory cell operation can be achieved.

More specifically, by changing the implant dose and energy, the relative population of ion-enhanced defects can be controlled as can the nature of such defects, i.e., whether substitutions, vacancies, and/or interstitials are created at the surface of the layer by ions passing through it versus substitutions, vacancies, and interstitial defects caused by ions coming to rest inside the lattice. Otherwise put, through dose and energy control, one may independently tune the concentration of these two populations of defects to desired levels. As will also be discussed further below, the ion implantation species may be selected to as to alter electrical properties of the implanted layer, e.g., to implant atoms having having different valence or conduction properties than represented by the native atomic structure, or to otherwise create charge differentials, through the defect generation in molecular structures or other mechanisms.

Without being bound by theory, it is believed that the choice of certain semiconductor materials to form memory cells (using the teachings of this disclosure) facilitates the formation of non-metallic percolation paths in connection with the defects just introduced. By controlling defect generation to have a consistent distribution and desired depth profile, one may tailor the formation of percolation paths. Memory devices based on these principles, in turn, can be manufactured to have a lower forming voltage (if needed to condition the memory device for first use) and tighter distributions of set and reset voltage.

As used in this disclosure, the set and reset voltages refer to the application of a potential to cause a multistable material or structure to change state. The material or structure can support two such states, or more than two states, and the "setting" of a first state refers to entry into that state from a second state, and the "resetting" refers to a switch back to the second state. Generally speaking, structures based on resistive state change may use a relatively low voltage to read or sense current state (without changing state), a second, higher voltage to set a particular state, and a third, even higher voltage, to cause the material to change back to a previous state. A typical interrelation between these voltages can be observed in FIG. 18.

FIG. 1 shows an exemplary memory cell 101 that may be based on the teachings provided by this disclosure. The memory cell includes a top electrode 103, a bottom electrode 105, a semiconductor device layer 107, and a substrate 109. The semiconductor device layer is sandwiched between the electrodes, such that when a potential difference is applied across the electrodes, current flows through the semiconductor device layer. The voltage is represented in FIG. 1 by the difference between quantities $V_1$ and $V_2$, and may reflect either polarity, depending upon embodiment. The semiconductor device layer may be initially formed as a single, integral layer or as a series of monolayers that have relatively uniform composition. The semiconductor device layer is subjected to differential processing, such that first and second regions 111 and 113 are formed within the layer. The first region 111 may also be referred to as a doping layer, and the second region 113 may be referred to as a semiconductor or insulator layer; it should be understood, however, that the term "layer" is used to encompass both the case where (a) multiple, distinct layers (e.g., the same or different materials) are deposited or fabricated as different regions, as well as (b) situations where a material or layer is processed post-fabrication to create the two regions.

As indicated by the text of FIG. 1, in one embodiment, the first region may be processed by ion bombardment, to create added defects (ideally having controlled depth and distribution), but to leave the second region substantially unprocessed (and thus dominated only by native defects, to the extent that such exist). An anneal or other process may, if desired, be used prior to ion bombardment in order to suppress or enhance native defects. This suppression may be useful in situations where it is believed the underlying semiconductor materials possess undesirable native defect properties. FIG. 1 also indicates the presence of one or more current steering or other optional layers 115, which may be desired for particular implementations. This layer or these layers 115 are illustrated in phantom lines to indicate their optional nature; optional layers may in fact be positioned between any of the other various layers depicted in FIG. 1 (although such is not necessarily shown in FIG. 1). For example, depending upon implementation, a smoothing, insulating, adherence, thermal, mask or conceivably any type of layer may be employed, as desired or appropriate. In the case where a current steering element is used, the optional layers may be configured to form an electrical semiconductor device (such as a diode or transistor) to facilitate electrical control over each individual memory cell. Irrespective of the presence or absence of these additional layers, surface treatment is utilized as referenced above to enhance properties of the fabricated memory cell. For example, through controlled ion bombardment, the memory cell depicted in FIG. 1 may be formed to require relatively low forming voltage, and to be set and reset in a more predictable manner.

It should also be understood that, as with all of the embodiments in this disclosure, the precise ordering of layers is to a certain extent arbitrary, depending on process. That is to say, for example, the first region may be above or below the second region, closer to the first electrode and the substrate than the second region, or in a different ordering relative to the various layers introduced above, all consistent with the teachings of this disclosure. Also, layers depicted as adjacent to one another need not be so positioned in all embodiments, as there may be other layers interspersed between them. For example, it may be possible to add another semiconductor device layer (e.g., a metallic oxide layer) between the first region 111 and top electrode.

II. Fabrication Process

Figure 2:
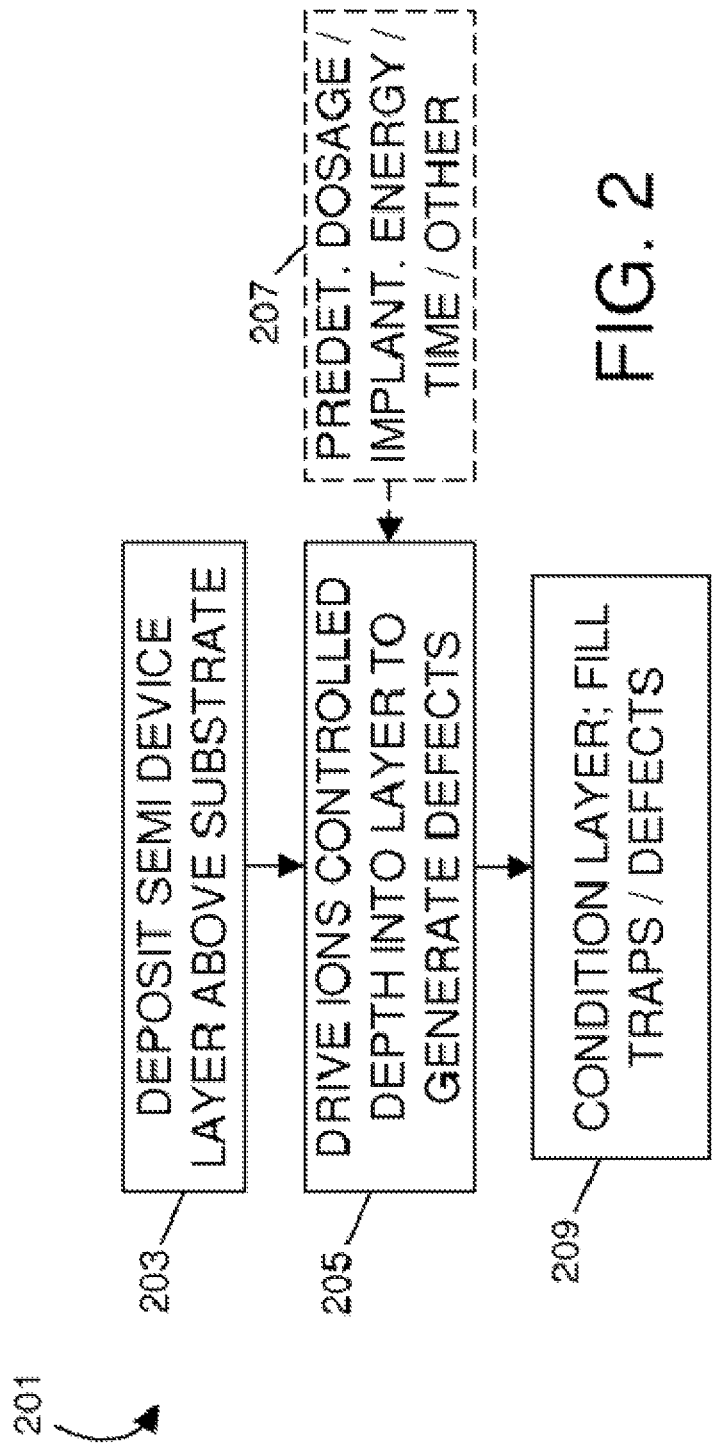
FIG. 2 is a functional block diagram of a method 201 of fabricating a semiconductor device layer through steps of depositing the layer, driving ions into the layer, and conditioning the layer (e.g., to at least partially fill traps or defects in the layer).

FIG. 2 illustrates a method 201 of forming a semiconductor device layer, such as the layer depicted in the middle of FIG. 1. Base material for the semiconductor device layer (typically a metal oxide) is first deposited above a substrate. The term "above" is used here to imply that there may also be other layers above the substrate but below the semiconductor device layer, for example, the bottom electrode, an optional layer, or both. As will be discussed below, a variety of fabrication processes may be used to build the semiconductor device layer, including physical vapor deposition ("PVD"), chemical vapor deposition ("CVD"), dry or wet processes, as well as any other conventional semiconductor fabrication process suitable to the materials involved. Once the semiconductor device layer is formed to a desired thickness, a surface treatment process is used to create defects, as was introduced above. In the example presented by FIG. 2, the surface treatment process used involves driving ions into the semiconductor device layer, for example, to generate defects, enhance or alter the lattice structure or displace lattice elements with ions having different electrical (e.g., valence or conduction) properties. The driven ions collide with molecules in the semiconductor device layer (e.g., with the metal oxide structure) to disrupt the native structure (e.g., crystals within the structure, as appropriate). Any conventional ion bombardment process may be used, for example, one that causes electrons to ionize an injected gas and that uses an acceleration grid to direct those ions against a target; other processes may also be used. As will be explained below, the ion bombardment process is typically pre-calibrated based on empirical data to use a specific dosage, implantation energy, time of exposure and similar parameters, all as indicated by phantom line block 207 in FIG. 2, to control the distribution of ions driven into the semiconductor device layer and the types of defects created. The depth of implantation is, generally speaking, a probabilistic event, with actual depth following a normal distribution. The average depth of penetration into the layer and the variation in defect populations are functions of the selected implantation energy, and the height of distribution (concentration of ions at any particular depth) is a function of the dosage (or equivalently, ion concentration and time of exposure). As alluded to above in connection with the description of FIG. 1, once the defect populations have been modified, additional layers may then be deposited to complete a memory cell (or other device), as appropriate.

The device may be subjected to a forming process or other conditioning event to at least partially condition the semiconductor device for first use. For example, a forming voltage may be applied to effectively set percolation paths that will be used within each memory cell and associated with change of resistive state. In embodiments that emphasize vacancy generation, the conditioning event may be used to replace vacancies with other elements through migration (for example, hydrogen, oxygen, or other species). A variety of mechanisms can be used as part of the forming event or process. For example, anneals or other physical modification processes (e.g., rapid thermal oxidation (RTO), forming gas annealing, etc.) may be used to partially prepare the device if appropriate to the particular design. Electronic processes can also be applied to condition structures for first use; for example, with resistive-switching memories, it is believed that percolation paths form in association with the defects and, consequently, it is frequently desired to form these paths using a forming voltage. In many of the embodiments discussed below, these percolation paths may be formed to exhibit non-metallic properties, e.g., through processes where changes in conduction exhibit behaviors associated with non-metallic species. The use of such a conditioning event is represented by block 209 in FIG. 2. Importantly, the forming process may be applied at any stage of fabrication, including following final layer deposition, or at some point in the middle of the deposition process.

Figure 3:
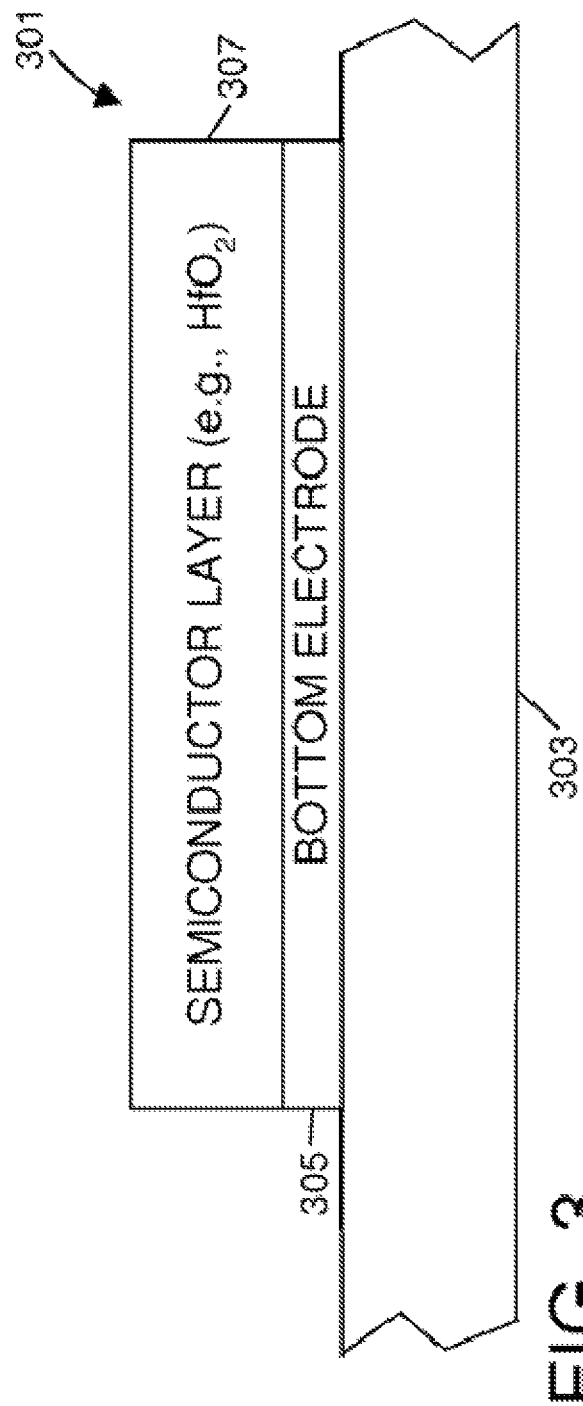
FIG. 3 is the first of a series of FIGS. used to illustrate the fabrication of a semiconductor device layer, such as the layer 107 from FIG. 1.
Figure 4:
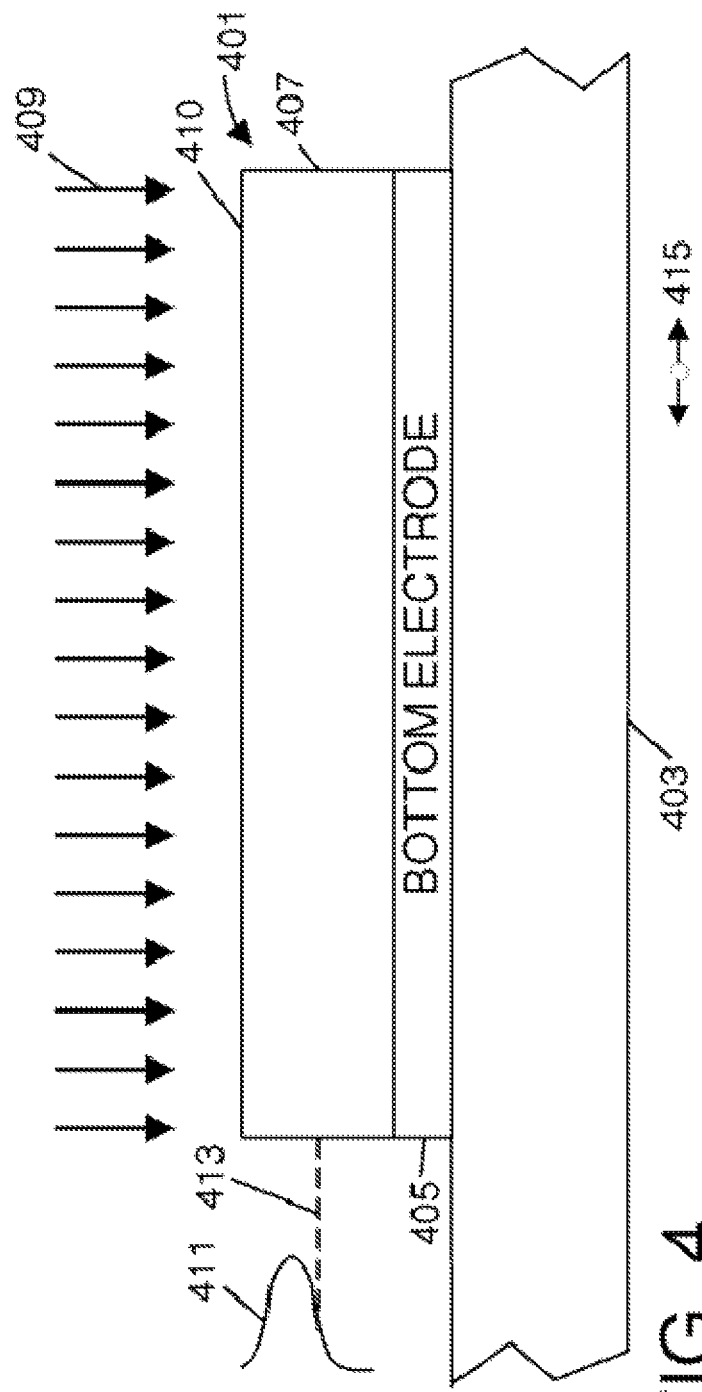
FIG. 4 is the second of a series of FIGS. used to illustrate the fabrication of a semiconductor device layer.
Figure 5:
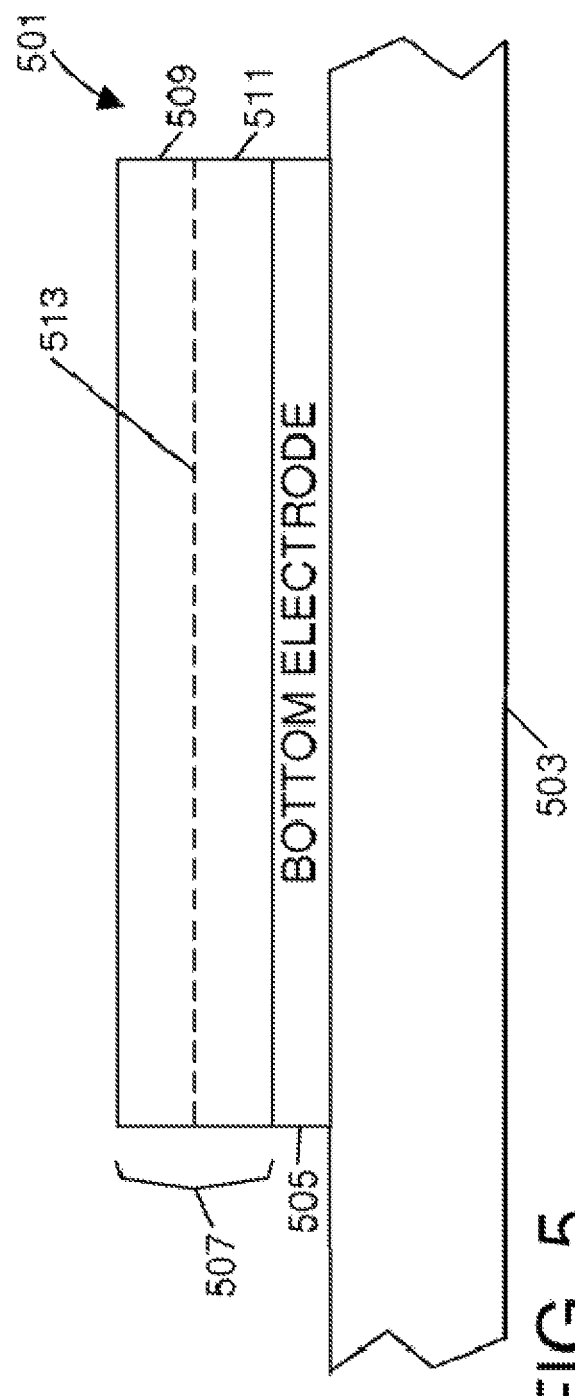
FIG. 5 is the third of a series of FIGS. used to illustrate the fabrication of a semiconductor device layer.

FIGS. 3-5 are used to provide additional detail regarding the ion bombardment process described in connection with FIG. 2.

In particular, FIG. 3 illustrates a device 301 having a substrate 303, a bottom electrode 305 and a semiconductor layer 307. In the example of FIG. 3, the bottom electrode may be formed of any conventional electrode material, for example, titanium nitride, copper, nickel, silicide, polysilicon or another conventional electrode material. The electrode 305 is depicted in FIG. 3 to be in direct contact with (e.g., formed upon) the substrate 303 and also in direct contact with the semiconductor device layer 307, though this need not be the case. As alluded to by FIG. 3, the semiconductor device layer can be formed of a metallic oxide (such as hafnium oxide, $HfO_2$). A variety of suitable materials will be discussed below in connection with the section dealing with the section of this disclosure dealing with implementation examples.

FIG. 4 illustrates the use of a surface treatment process to bombard a surface of the semiconductor device layer. In FIG. 4, the device is generally represented by numeral 401, while numerals 403, 405 and 407 refer to the substrate, bottom electrode, and semiconductor device layer, respectively. A set of arrows 409 indicate that ions are directed downward to bombard a surface 410 of the semiconductor material, with ions being driven approximately perpendicularly into the material (e.g., into the hafnium oxide), though the trajectory may be varied somewhat (e.g., 83 degree angle) to avoid an number of deleterious effects arising from a purely perpendicular implant. It is understood that any angle may be used, and that the implantation angle may depend on the implanted ion, the material receiving the implant, the implantation equipment, and other factors. Importantly, as mentioned earlier, the parameters associated with ion implantation may be varied so as to tailor the implantation to create specific types or distributions of defects. Examples of such parameters and their variation are described more fully below, especially in connection with FIGS. 12 and 13. For purposes of FIG. 4, this variation is represented symbolically by a normal distribution curve 411, depicted at the left-hand side of FIG. 4 to represent that the number of ions implanted into the semiconductor device layer are preferably varied in their distribution, i.e., such that ions are distributed in a depth-wise manner to have a normal distribution as represented by the distribution curve 411. A phantom, horizontal line 413 indicates that this distribution is selected so as to form defects above line 413 (i.e., to create the first region), while not substantially creating additional defects below the line 413. Notably, one advantage of the process depicted by FIG. 4 is that it lends the process to creation of a relatively uniform cross-sectional distribution for ion implantation (and associated defect generation). That is to say, distribution in a plane represented by an arrow set 415 (and extending "into the page" of FIG. 4) can be made to be relatively uniform, which may not be true for native defects in the underlying semiconductor material. Thus, the ion implantation process may be used to apply uniformity of defects across the semiconductor device layer.

FIG. 5 illustrates a device 501 where the semiconductor device layer has been surface treated to create two different regions. In particular, the device includes a substrate 503, a bottom electrode 505, and the semiconductor device layer 507, the latter including the first region 509 and the second region 511. As mentioned above, the surface treatment process (ion bombardment in this embodiment) is structured to create and/or modify additional defects in the first region only, above a depth in the metallic oxide represented by phantom line 513, without creating any substantial defects in the second region below this line. In at least one embodiment discussed herein, the first region is approximately one-half thickness of the overall semiconductor device layer 507. That is to say, the defects added by ion bombardment are created in this particular embodiment to exist only in the top half of the semiconductor layer. For example, if a 150 Angstrom semiconductor device layer is used, defects can be added through ion bombardment in the top 75 Angstroms only. In other embodiments, the first region can be differently structured, for example, to encompass 60%, 40%, 25% or a different portion of the semiconductor device layer, or penetration to a specifically desired depth (e.g., 40 Angstroms).

Figure 6:
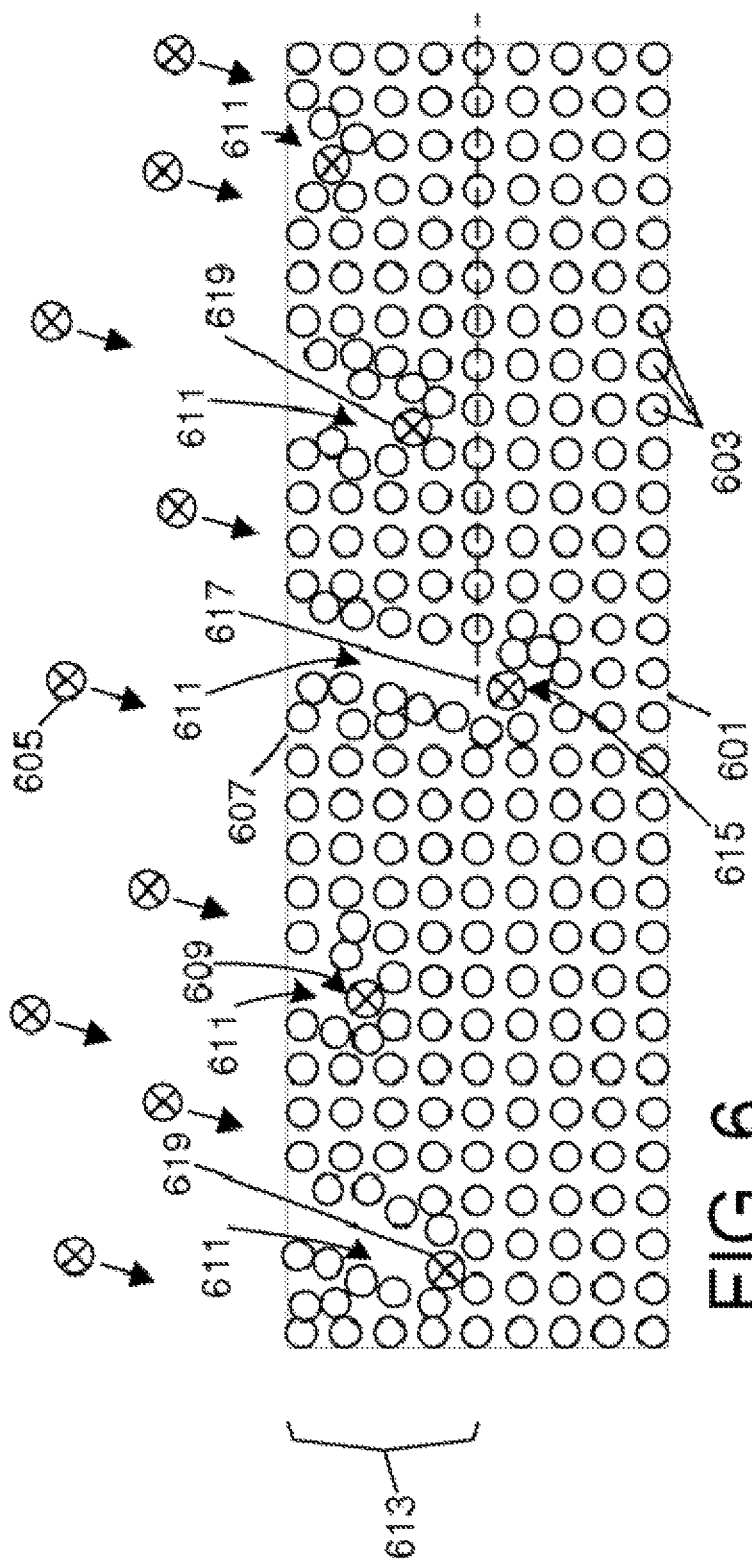
FIG. 6 is a diagram used to illustrate ion bombardment to deliberately create defects 611 within a first region 613 of the semiconductor device layer.

FIG. 6 illustrates the physical effects of ion bombardment such as might be experienced by the substrate during the ion implantation described above. FIG. 6 shows a semiconductor device layer 601 that is made up of a number of atoms 603. As introduced above, it is desired to bombard the semiconductor device layer with ions 605 in order to add various defects, above and beyond any defects that may already exist in the semiconductor device layer, or to modify existing defects. The ions 605 penetrate the surface 607 of the semiconductor device layer and collide with atoms 603 that make up that layer, finally coming to rest at some depth within the layer (as exemplified by reference numeral 609). As mentioned previously, the depth of implantation follows a probabilistic model, with actual depth of implantation based on the ion implantation energy used in the bombardment process and the number of molecules impacted. As each ion 605 penetrates the semiconductor layer, it leaves behind vacancies 611 and interstitials 619 that, for at least some embodiments, facilitate the multistable resistance properties introduced above. The ion implantation process may be controlled so as to add vacancy defects, interstitial defects, or other defects substantially only up to a predetermined depth, as indicated by numeral 613. The ions that penetrate the layer may actually penetrate greater than this depth (e.g., as represented by ion 615 depicted below a phantom line 617), but the distribution of penetration is such that virtually all added defects subsist above this level. The ions 615 may also be used to create deliberately injected substitutional or interstitial defects. Further detail on the relationship depth of ion implantation and associated collision events and defects may be observed by referring to FIGS. 12 and 13.

Figure 7:
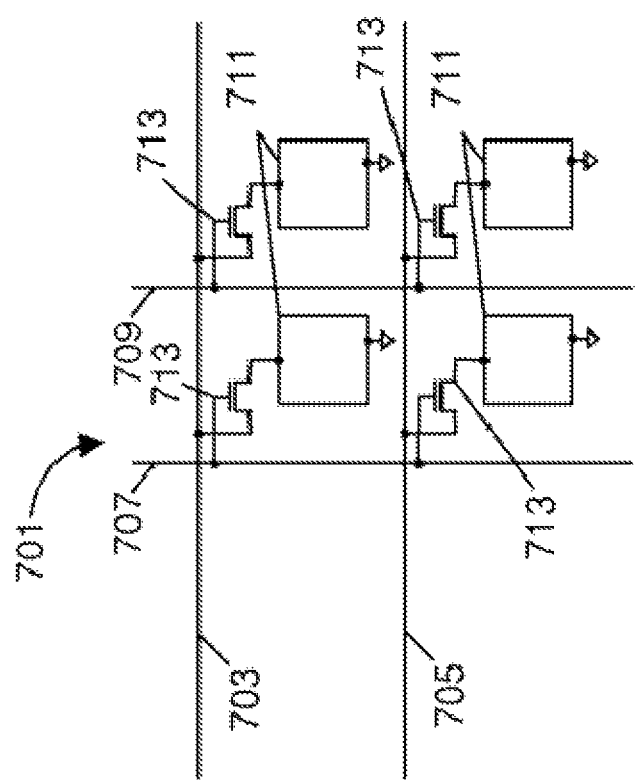
FIG. 7 is a diagram of a memory array 701 that includes a number of memory cells 711, each based on a three-terminal (e.g., horizontal) design.
Figure 8:
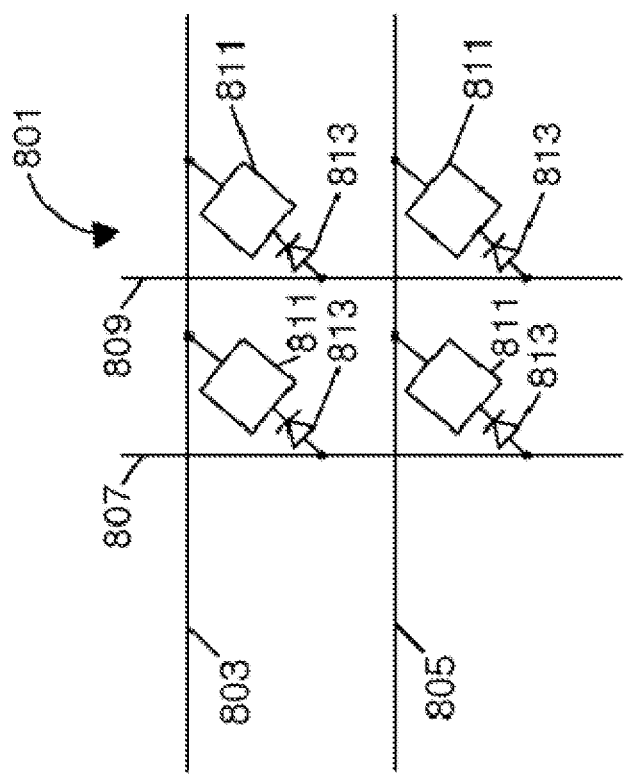
FIG. 8 is a diagram of a memory array 801 that includes a number of memory cells 811, each based on a two-terminal (e.g., vertical) design.

As mentioned earlier, individual memory cells may be formed based on these principles and may include a current steering layer or control device to control operation of each memory cell. FIGS. 7 and 8 indicate two embodiments that rely on such devices to control operation of an array of memory cells. The embodiment of FIG. 7 relies on a transistor to gate control of each memory cell, and the embodiment of FIG. 8 relies on a diode to help control each individual memory cell.

More particularly, FIG. 7 presents an array 701 based upon individual bit lines 703 and 705 and column lines 707 and 709. Each combination of a unique bit line and column line is used to access a memory cell 711 by turning on an associated transistor 713. For example, a voltage placed on one particular column line 707 will turn on all transistors associated with the column, and a voltage simultaneously placed on bit line 703 is then coupled to the memory cell defined by the unique combination of lines 707 and 703. The magnitude of the voltage and (for some embodiments, polarity also) determines whether the associated memory cell is set or reset, or is read without changing memory contents. The transistor embodiment is sometimes referred to as a "horizontal" structure, referring to the way that the structure is typically laid out, i.e., the transistor is typically placed adjacent to the memory cell structure (although it is also possible to combine the transistor with the memory cell structure, or otherwise structure it in a vertical manner, as represented by current steering layers introduced earlier).

FIG. 8 also shows an array 801 that is also based on multiple bit lines 803 and 805, and multiple column lines 807 and 809, with each unique combination of lines controlling which memory cell 811 is accessed. The configuration of FIG. 8 shows each memory cell 811 in tandem with a diode 813, with the latter helping discriminate the cell for which access is desired depending on whether the associated voltage drop (between an associated bit line and column line) meets the Schottky-Barrier threshold of the diode. The embodiment seen in FIG. 8 is sometimes referred to as a "vertical" structure, because the diode is often configured as multiple, vertically stacked layers on top of or within each memory cell (e.g., current steering layers). It is also possible, of course, to configure diodes in a horizontal manner or otherwise removed from the memory device.

With the configuration and fabrication of an exemplary memory device thus introduced, additional details of the effects of surface treatment on operation and reliability will now be discussed, in reference to FIGS. 9-11. Following this discussion, with reference to FIGS. 12-14, data will be presented on how one may tailor the processes described above to create defects (vacancies, interstitials and/or substitutions) to support multistable operation. Finally, implementation examples will then be presented with reference to FIGS. 15-22, with discussion of materials that may be used, and associated tradeoffs.

III. Effect on Device Operation and Reliability

Figure 9:
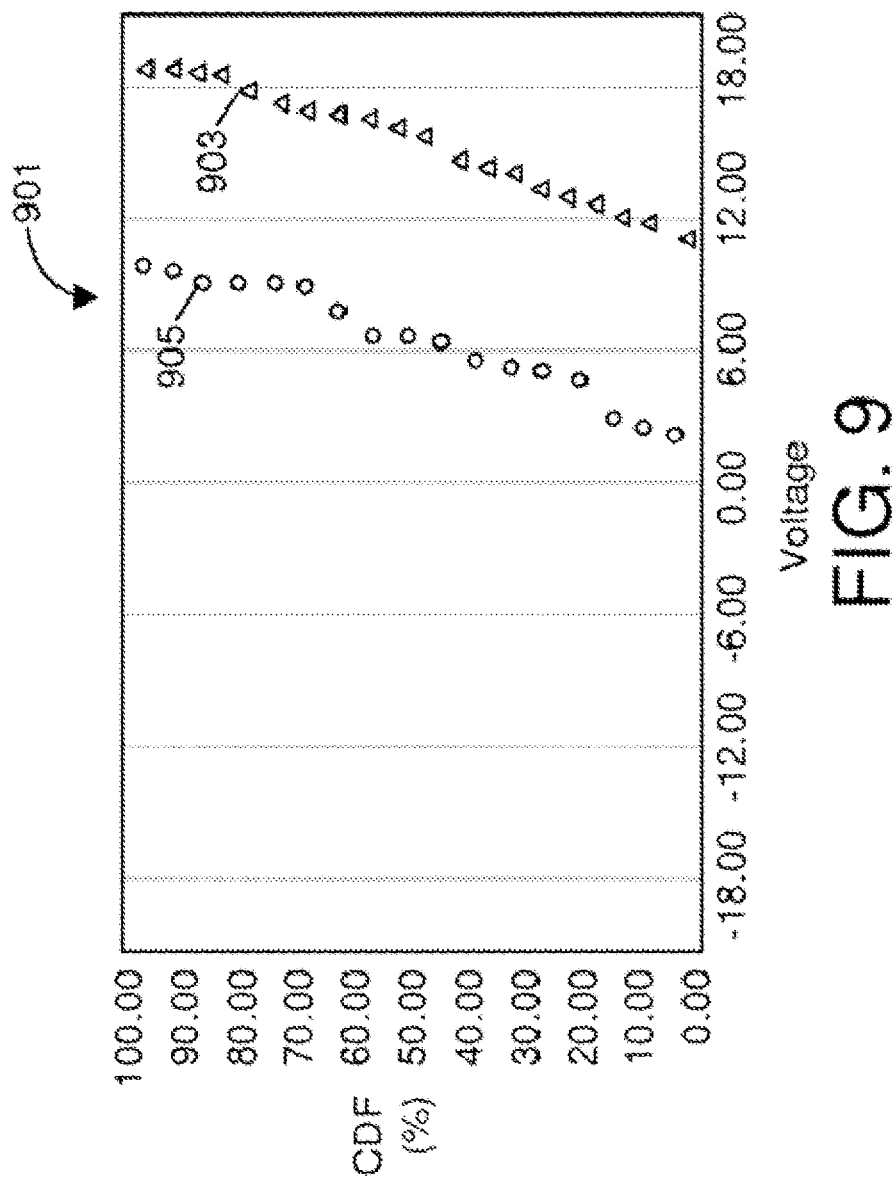
FIG. 9 shows a plot 901 of forming voltage, e.g., a voltage used to condition resistive read-only memory ("ReRAM"), expressed as a cumulative distribution function ("CDF"). Points associated a memory device having only native defects are represented by triangles 903, while points associated with a similar device but bombarded with ions to create tailored populations of defects are represented by circles 905.

FIG. 9 shows a plot 901 that compares forming voltage for two different samples based on like-materials (e.g., hafnium oxide), where one sample has been surface treated in accordance with the principles discussed above and where another sample has not. Otherwise put, for samples consisting of many memory cells, each having silicon processing variations, FIG. 9 indicates the distribution of maximum forming voltage needed to trigger an initial state change for the various memory cells. Numeral 903 and small triangle symbols represent data based on a hafnium oxide memory cells with no surface treatment on the metallic oxide layer, whereas numeral 905 and circle symbols represent hafnium oxide memory cells where the metallic oxide layer has been the subject of an ion bombardment process, for example, as discussed above in connection with FIGS. 2-6. What the cumulative distribution data shows, for example, with reference to the untreated hafnium oxide memory cells, is that approximately 10 percent of cells require a forming voltage of about 12 Volts DC to trigger a first state change, while approximately eighty percent of the memory cells will have their initial state successfully changed if a voltage of about 18 Volts DC is applied. By contrast, the memory cells where ion bombardment has been used to enhance defects require a significantly smaller forming voltage—FIG. 9 indicates that ten percent of the hafnium oxide memory cells at issue may be successfully set with a voltage of below 3 Volts DC, whereas eighty percent of memory cells may be successfully set with a voltage below 9 Volts DC.

Forming voltage can often be an important parameter associated with resistive switching memories. Simply put, a maximum voltage must often be applied in order to get a memory cell to change state for the very first time. One theory as to why a relatively larger voltage is needed for this initial state change is that the forming event may involve the building of paths needed for conduction, e.g., through species migration, charge migration, or other mechanisms. The mechanism for filling these defects or traps is not completely understood, but it may be mechanism based on ion or electron mobility, atomic (e.g., oxygen) mobility or another mechanism. Once state has been changed once, a smaller voltage is subsequently needed to form and break percolation paths associated with charge mobility—the set and reset voltages therefore settle to a steady state. Since large voltages can induce large currents that can potentially damage the memory cell, and since the largest voltage typically needs to be applied for the very first state change, the forming voltage is typically of concern for resistive switching memory devices, particularly since the required voltage can vary from cell to cell in association with silicon processing variations. To minimize the potential damage, a minimal forming voltage and small to no variation in required forming voltage is usually desired. It should be readily observed that the data presented in FIG. 9 suggests that use of the surface treatment processes discussed above provides substantial advantage in reducing forming voltage.

Figure 10:
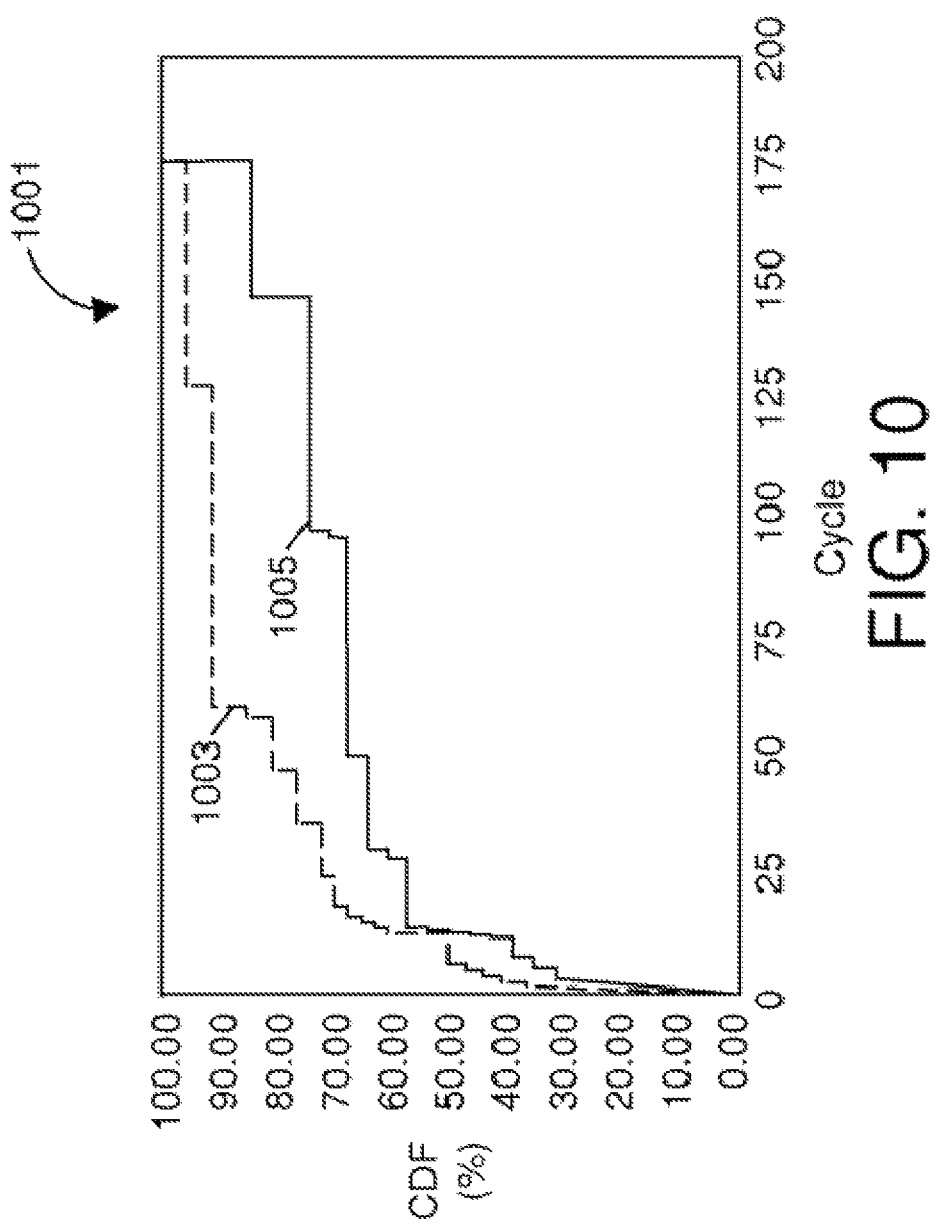
FIG. 10 shows a plot 1001 of device failure characterization as a function of set/reset voltage cycle. A first line 1003 plots failure as a function of set/reset cycle for a hafnium oxide sample having only native defects, while a second line 1005 plots failure for a hafnium oxide sample bombarded with ions to create additional defects.

FIG. 10 presents failure analysis for memory cells which have failed, as a function of cycle. In particular, a plot 1001 shows cumulative failure data for failed cells based upon number of cycles of operation, with a phantom line 1003 representing failed cells based on un-treated hafnium oxide, and a solid line 1005 representing failed cells based on ion-bombarded hafnium oxide. A cell fails when it can no longer be set and reset, and the data presented in FIG. 10 suggests that the surface treatment processes discussed above retards failure, i.e., the cells based on treated hafnium oxide which fail generally failed after a greater number of cycles. [This data is skewed towards the left-hand vertical axis, i.e., because forming voltage is typically the greatest voltage used, to trigger an initial set or reset of a memory cell, the cells that do fail tend to fail earlier because of the larger required current.]

It is believed that by creating a more consistent distribution of defects across device width, and matching a desired depth of penetration, the principles discussed above help reduce forming voltage, because the resistances associated with each state of the device may be made more predicable. Because the resistances are more predictable, there is a better expectation and around the voltages needed to form and break percolation paths associated with multistable operation and the ability to minimize those voltages—that is to say, it is believed that tighter distribution around these values helps avoid excessive voltages and associated currents.

Figure 11:
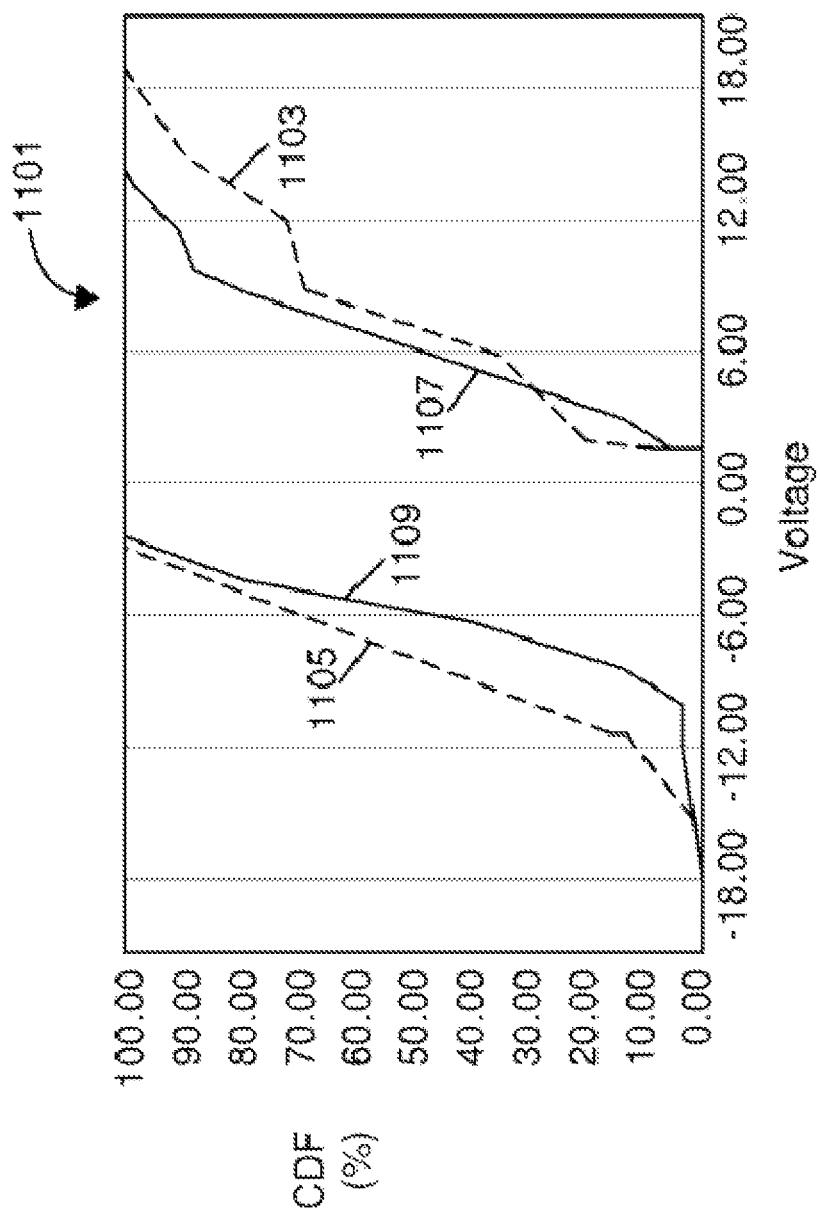
FIG. 11 is a comparative cumulative distribution plot 1101 for set and reset voltages for memory devices associated with hafnium oxide samples. In particular, dashed lines 1103 and 1105 correspond to set and reset voltages, respectively, for a device based on un-implanted hafnium oxide, and solid lines 1107 and 1109 correspond to set and reset voltages, respectively, for a device based on implanted hafnium oxide.

FIG. 11 presents a plot 1101 that compares set and reset voltages for treated and untreated hafnium oxide-based memory cells. In particular, numerals 1103 and 1105 show set and reset voltages, respectively, for memory cells based on un-implanted hafnium oxide-based memory cells, while numbers 1107 and 1109 show set and reset voltages for hafnium oxide-based cells that have been the subject of ion-bombardment surface treatment. The data shows a substantially tighter distribution for the treated memory cells, which is to say, the cumulative distribution for set and reset voltages for the ion-bombarded hafnium oxide-based cells are both "more vertical" and generally are closer together. This result also indicates that device reliability and the use of lower voltages are enhanced using the fabrication methods discussed above.

With some of the benefits of ion bombardment thus presented, variables affecting the ion bombardment process will now be discussed, with reference to FIGS. 12-14.

IV. Tailoring Dosage and Implantation Energy

Figure 12:
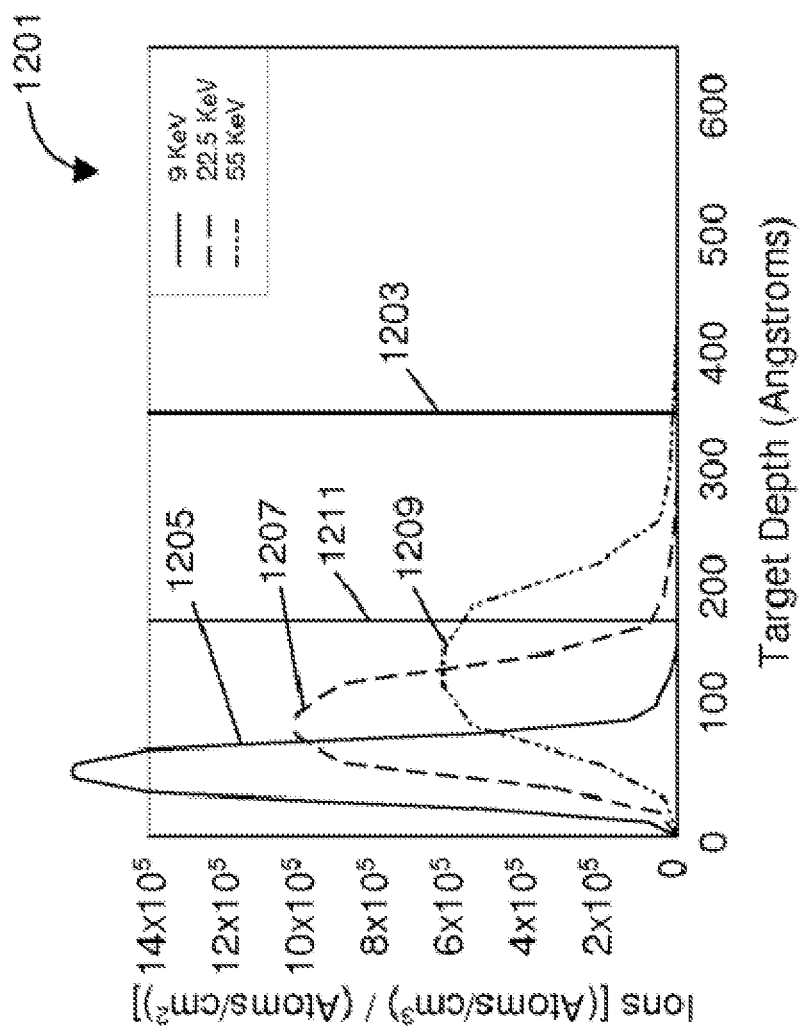
FIG. 12 shows a plot 1201 of ion density against target depth in Angstroms for each of three samples, each sample processed using different ion bombardment parameters. In particular, a first curve 1205 corresponds to a sample processed using an implantation energy of 9 keV (kilo-electron volts), a second curve 1207 corresponds to a sample processed using an implantation energy of 22.5 keV, and a third curve 1209 corresponds to a sample processed using an implantation energy of 55 keV. Two vertical lines are also plotted, including a first line 1203 that represents target depth (i.e., depth of the semiconductor device layer), with a second line 1211 that represents half that depth.
Figure 13:
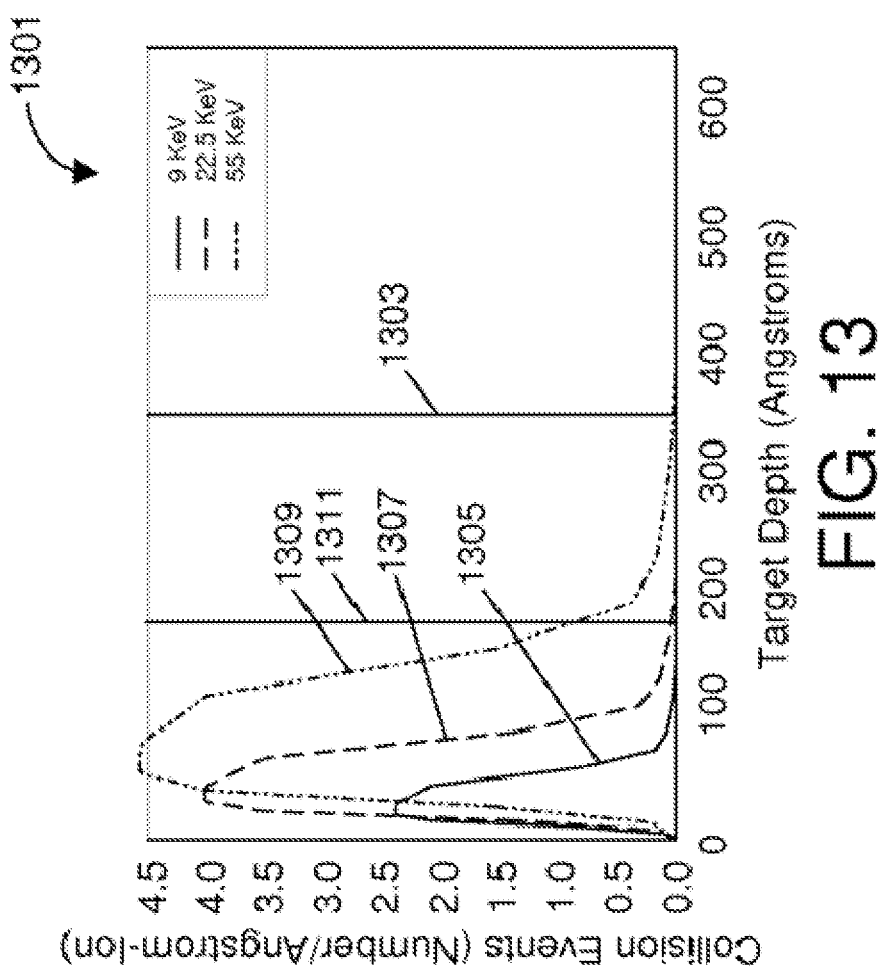
FIG. 13 shows a plot 1301 similar to the one seen in FIG. 12, but that instead shows collision effects for the examples first introduced by FIG. 12. That is to say, first, second and third curves (1305, 1307 and 1309) correspond to the ion distributions 1205, 1207 and 1209 in FIG. 12 and effectively show deliberate addition of defects only within approximately the first half of semiconductor device layer thickness.

FIGS. 12 and 13 respectively present data showing how ion implantation energy can affect the depth of ion implantation and, correspondingly, defect generation.

In particular, FIG. 12 shows a plot 1201 associated with a 350 Angstrom thick semiconductor device layer. This thickness is depicted by a vertical line 1203 with the horizontal axis representing depth of ion penetration; the area to the right of this line represents the extent of ion penetration through the semiconductor device layer and into an adjacent layer, and the area to the left of this line represents ion depth within the semiconductor device layer. Three curves are superimposed on this plot, each representing a like dosage. A first curve 1205 provides data associated with a 9 KeV implantation energy, while second and third curves 1207 and 1209 present data associated with a 22.5 KeV and 55 KeV implantation energy, respectively. A second vertical line 1211 is also presented to identify the halfway depth within the semiconductor device layer. As indicated by FIG. 12, depth of ion implantation is almost exclusively a function of implantation energy, with dosage determining the concentration or "strength" of ion representation at a particular depth. Notably, the ion implantation associated with the first two curves 1205 and 1207 is controlled to almost exclusively remain in the top-half of the semiconductor device layer, while the third curve 1209 reflects ion implantation primarily in the top half, but also with a substantial number of ions implanted in the bottom half (i.e., the second region) of the semiconductor device layer. Each of the three bombardment processes is configured so that ions are implanted substantially only within the semiconductor device layer, i.e., such that ions for the most part do not pass completely through this layer and into an adjacent layer, such as an electrode. As with the examples presented above, the data depicted in FIG. 12 is based upon hafnium ions implanted into a metal oxide, namely, hafnium oxide.

Notably, ion implantation need not involve an ion species of a material already present in the semiconductor device layer. For example, the ion bombardment may be selected to involve an ion species where it is desired to change the valence state as part of the defect generation. The variation of ion species changes the character of the added defects and, thus, the switching properties of the finished product. For example, implantation of Hafnium Oxide with Aluminum or Yttrium ions would yield a "1+ defect" when substituted for Hafnium, while implantation of Tantalum or Niobium ions would yield a "1− defect" when substituted for Hafnium.

FIG. 13 presents a plot 1301 of numbers of collision events from this ion implantation. This data is a direct measure of the generation of vacancy and interstitial defects, as each ion passing into the semiconductor material (e.g., amorphous, crystalline or other structure) will result in the number of collisional displacements of atoms that are shown on the y-axis of this plot at each distance into the that semiconductor material that is shown on the x-axis. As with the case presented above, a vertical line 1303 represents thickness of the semiconductor device layer, with area to the right of this line representing an adjacent layer (e.g., an electrode) and area to the left of this layer representing the depth of the collision event (that is, the depth of associated defects) within the semiconductor device layer (i.e., within the metal oxide). The curves presented represent the number of collisions per Angstrom thickness of the layer. Three curves are indicated in FIG. 13, including a first solid line curve 1305 (corresponding to the smallest implantation energy, i.e., curve 1205 in FIG. 12), a second, dashed-pattern curve (corresponding to a 22.5 KeV implantation energy associated with curve 1207 from FIG. 12) and a third, dashed-dot pattern curve (corresponding the 55 KeV curve from FIG. 12). Notably, even for highest implantation energy discussed above, which resulted in ions penetrating past the layer midway depth 1311, substantially all of the defects (e.g., ninety percent or more) nevertheless lie within the top half of the semiconductor device layer (i.e., to the left of the vertical line 1311). Thus, if it is desired to create defects through approximately half of the semiconductor device layer, FIG. 13 suggests that a relatively greater implantation energy may be used, up to a limit that avoids substantial ion penetration beyond the limits of the semiconductor device layer. Importantly, one skilled in the art may experiment with dosage and implantation energy, given the materials and memory cell design at issue, in order to tailor defect generation to create appropriate resistance states and discrimination between resistance states. The value in these two sets of plots, is that by increasing energy one is able to increase semiconductor vacancy/interstitial defect pair generation relative to defects arising from the stopped ion (substitutions and ion interstitials). That is, the area under the three curves in FIG. 12 are equal, but the areas under the three curves in FIG. 13 are radically different, allowing one to tailor the energy and dose of the implant to achieve a particular concentration of each type of defect.

The examples presented above focused on ion implantation using metal ions, namely, hafnium in the examples presented, but as mentioned, other types of ions can be used as well, including non-metal ions. This ability supports the theory advanced above that the mechanism for multistable operation is not based on conductive metal filaments, i.e., that the defects created by ion implantation are what are important, rather than implanting metal ions to themselves form conductive paths.

Figure 14:
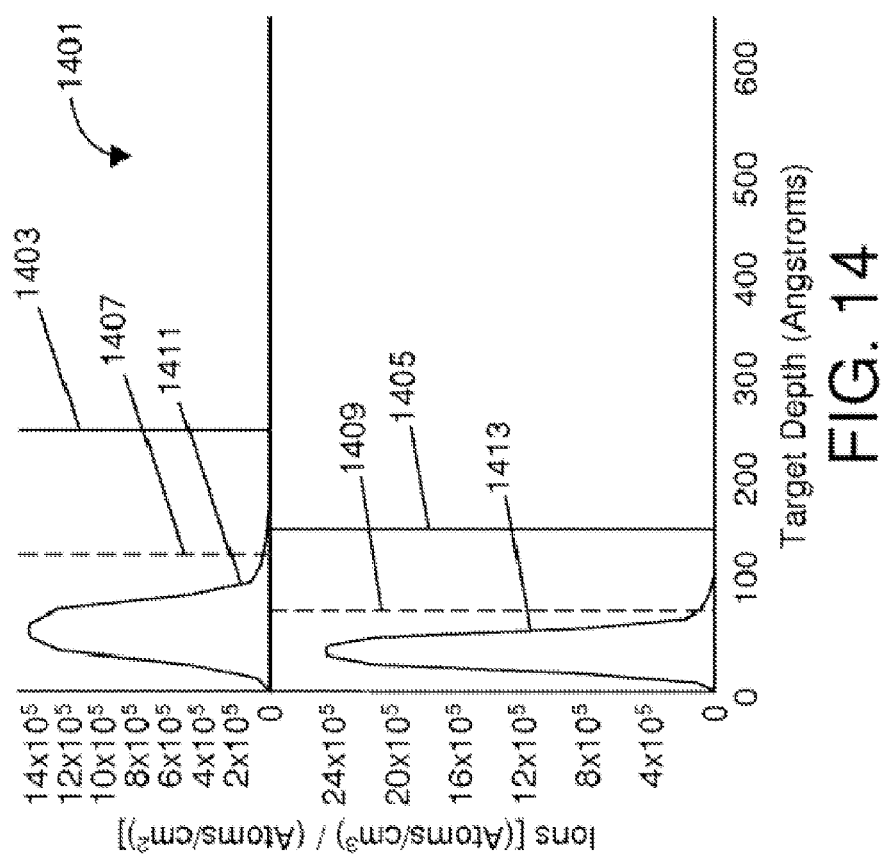
FIG. 14 is a comparative graph 1401 that illustrates ion implantation distribution for oxygen ions in a titanium oxide ($TiO_2$) film, for a given dosage of ions. In particular, a first curve 1411 shows how implantation energy may be tailored to distribute ions only within the first half thickness of a 250 Angstrom thick semiconductor layer, while a second curve 1413 shows how implantation energy may be used to distribute ions only within the first half thickness of a 150 Angstrom thick layer.

FIG. 14 presents a combination graph 1401 for samples that use oxygen ions as the implantation species. In particular, the upper portion of the graph 1401 presents data for oxygen implantation of a 250 Angstrom thick titanium oxide ($TiO_2$) layer (250 Angstroms is represented by a vertical line 1403), while a bottom portion of the graph presents data for oxygen implantation of a titanium oxide layer that is 150 Angstroms thick (represented by numeral 1405). As with several of the embodiments introduced above, implantation energy is selected to create defects that extend only through about half of each semiconductor device layer, represented by numerals 1407 and 1409, respectively. Two curves are presented, including a first distribution curve 1411 that shows the depth of ion implantation for the 250 Angstrom titanium oxide sample, and a second distribution 1413 that shows implantation depth for the 150 Angstrom sample.

V. Implementation Examples

With an overview of materials and devices, fabrication processes and methods that may be used to enhance device operational characteristics thus presented, specific devices will now be discussed in greater detail. The embodiments presented below identify specific materials that may form the basis for devices of one or more memory cells, or arrays of such cells. The discussion that follows will focus on the fabrication of resistive-switching cells having two stable states, including a high resistance state (that consequently has a relatively low "off" current associated with it), and a low resistance state (that consequently has a relatively high "on" current associated with it).

Certain memory designs involve a controlled state change that is detectible in an electrical characteristic associated with each memory cell. ReRAM is one example of such a design where state changes in resistive-switching are manifested in terms of changes in current flow. The changes occur at the atomic or molecular level and one theory is that structural defects are physically altered to change effective resistance (and, thus, the current that flows through a memory cell for a given voltage). This discussion is used only for purposes of illustration and introduction; that is to say, without being bound by theory, it is believed that the defects establish traps that may be filled by atoms, molecules, ions or electrons, either that are free, or that are associated with a molecular change that occurs within the fabricated material. A conditioning event may be used to process these traps, so as to engender a repeatable event where percolation paths may be formed and dissolved as the associated memory cell is set or reset.

It will be recalled that the data presented above represents deposition of a 150-350 Angstrom thick semiconductor device layer, consisting substantially of hafnium oxide or titanium oxide. Other thicknesses and materials are also possible.

Figure 15:
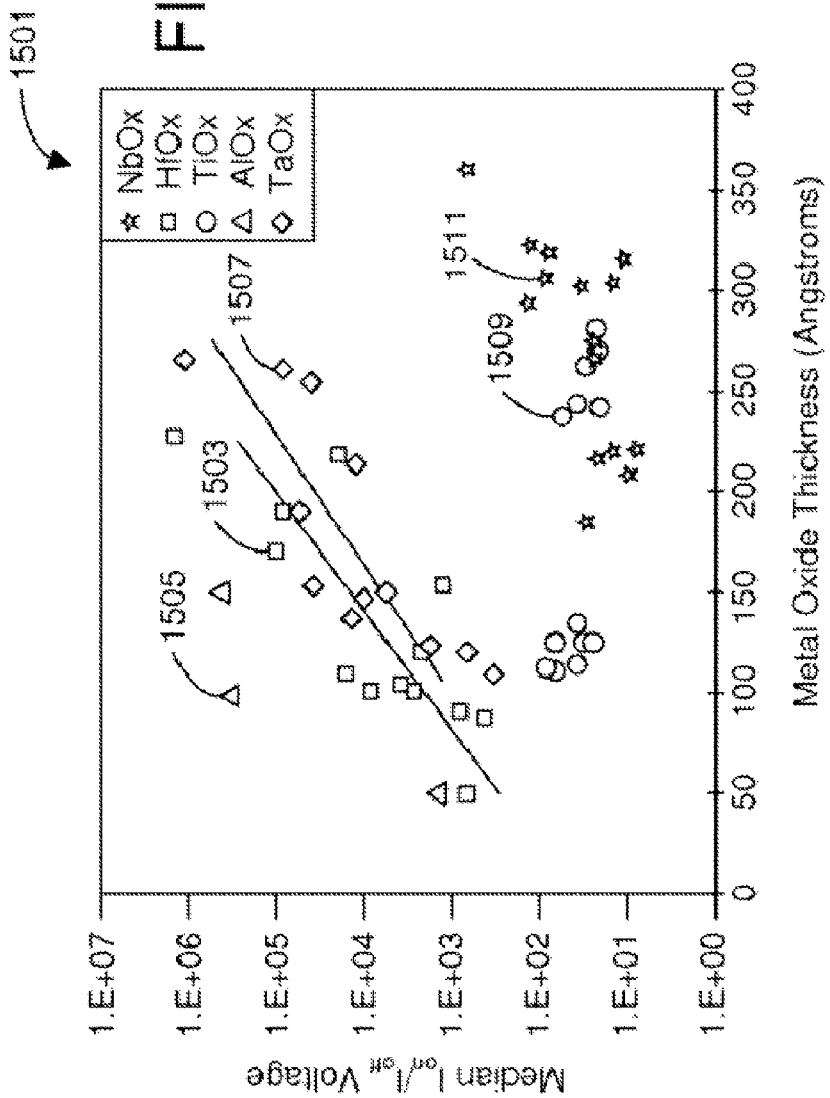
FIG. 15 is a graph showing the relationship between thickness of a metal oxide layer and ratios of "on" current to "off" current ("$I_{on}/I_{off}$") for several materials used in memory cells described herein. The nomenclature "on" current is used herein to refer to a current flow associated with a state other than the base state (e.g., with the base state being the highest resistance state, in which current flow is lowest) rather than strictly requiring that only two states be present. The data presented in FIG. 15 shows that, for at least certain semiconductor materials, the $I_{on}/I_{off}$ ratio is not linear with semiconductor device layer thickness, and thus supports the notion that resistive switching mechanisms (a) tend to be non-metallic, and (b) are likely generated proximate to the interface between different layers, e.g., such that they may be enhanced by the surface treatment procedures provided by this disclosure.

While by no means exhaustive as to these materials, FIG. 15 presents a graph 1501 that identifies the ratio of "on" current to "off" current ($I_{on}/I_{off}$) for a number of materials, including oxides of niobium, hafnium, titanium, aluminum and tantalum. As will be discussed further below, in some embodiments, oxides of hafnium, aluminum and tantalum in particular are of special interest, because they each represent higher bandgap materials, that is, where the bandgap is at least four electron volts (eV). Generally speaking, it may desired not only to minimize "off" current in a multistable memory device, but also to maximize the difference between current flows associated with each state of the device (i.e., to provide good discrimination between the resistances of "on" and "off" states).

The graph in FIG. 15 indicates two things. First, for higher bandgap materials, a higher ratio of $I_{on}/I_{off}$ be obtained, as can a ratio that increases somewhat with layer thickness. Second, the data presented in FIG. 15 also indicates a non-origin intersection of data curves (or at least that data may be non-linear for low semiconductor device layer thicknesses). This data, in turn, indicates that multistable properties may also have some correlation with layer interfaces, rather than being rooted in the formation of conductive metal filaments—simply stated, as will be described below in connection with FIG. 20, it is believed that the conduction mechanisms are non-metallic and are at least partially defined by defects existing at the interface between the semiconductor material layer and an adjacent layer (e.g., an adjacent electrode). This is not to imply that switching mechanisms are engendered only by surface conditions, i.e., the conduction properties may involve some combination of bulk effects and interface effects.

Higher bandgap materials are exemplified by materials such as hafnium oxide, aluminum oxide and tantalum oxide, denoted by data sets 1503, 1505 and 1507 in FIG. 15. Hafnium oxide, for example, has a bandgap of 5.7 eV, while aluminum oxide and tantalum oxide have bandgaps of 8.4 and 4.6 eV, respectively. These materials provide a relatively high $I_{on}/I_{off}$ ratio, substantially better than the ratio associated with data 1509 and 1511 for titanium oxide and niobium oxide (both having bandgaps of less than 4.0 eV, 3.0 and 3.4 eV, respectively). Thus, it may be preferred in some embodiments to fabricate a semiconductor device layer from materials having a bandgap of at least 4.0 eV, to enhance discrimination between current flows associated with each state of a multistable device. Zirconium oxide and yttrium oxide are also high bandgap materials that it is believed may be also employed to this end. Notably, these materials and processes are exemplary only, and may not be desired for all implementations; for example, while promoting generally high $I_{on}/I_{off}$ ratios, high bandgap materials may not be the most appropriate materials where other electrical characteristics are to be emphasized. By contrast, data associated with the lower bandgap materials (titanium oxide and niobium oxide) clearly indicate a linear trend that does not depend on thickness of the metallic oxide layer, which in turn suggests a substantially non-metallic conduction mechanism.

Figure 16:
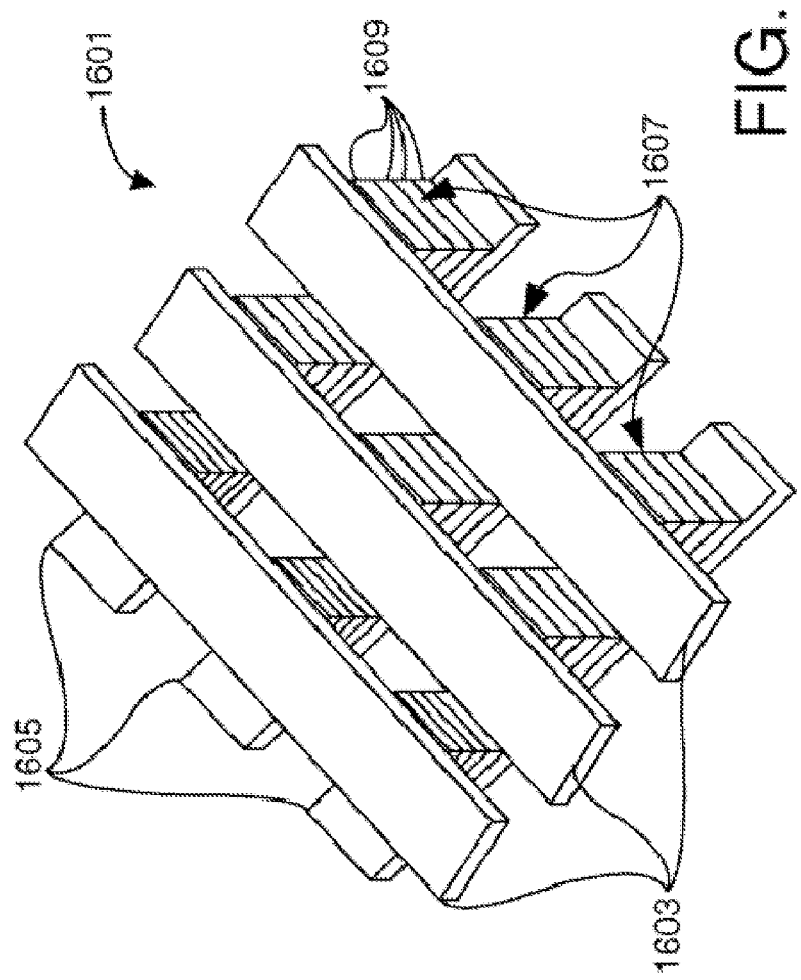
FIG. 16 is a three-dimensional view depicting components of an array 1601 of multistable memory cells. Each cell if desired may be fabricated according to the principles described herein.

A device may be fabricated as an array of ReRAM cells. FIG. 16 illustrates an array 1601 having a number of such cells 1603. The array itself may be part of an integrated circuit or another type of memory device (not seen in FIG. 16). Each cell 1603 seen in FIG. 16 typically is configured as a MIM ("metal-insulator-metal") stack that includes one or more metal oxide semiconductor device layers between two metal electrodes, where the device is multistable (i.e., exhibits two or more stable states each having different impedance). Energy typically is not required to maintain these states, such that these states may be used to store digital data for use in electronics applications in the absence of power. Read and write circuitry (also not seen in FIG. 16) may be connected to individual signal lines 1605 and 1607; these signal lines are also sometimes called "word" lines and "bit" lines, respectively, or "row" lines and "column" lines. These signal lines 1605 and 1607 are used to read data from and write data into the various cells 1603 in the array. As mentioned above and as will be described further below, each cell 1603 may be formed from one or more layers (such as exemplified by numeral 1609); one or more of these may be semiconductor device layers, fabricated in particular to include metal oxides according to the processes introduced above. The arrays depicted in FIG. 16 can be further stacked in a vertical fashion to make three-dimensional memory arrays. The scheme introduced here and depicted in FIG. 16 is merely illustrative.

Figure 17:
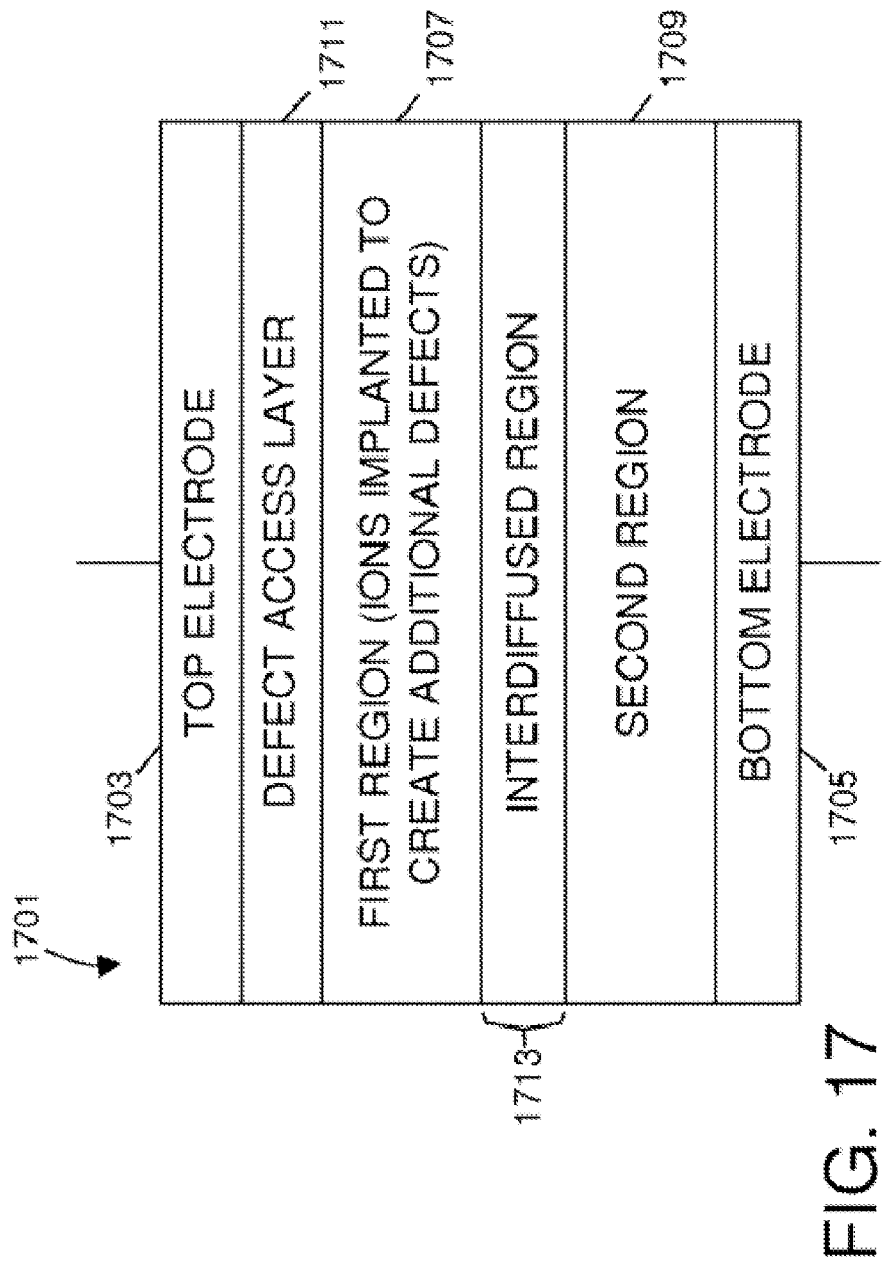
FIG. 17 shows an exemplary multistable memory cell; the particular cell illustrated in FIG. 17 includes first and second regions, as described earlier, and one or more defect access layers.

FIG. 17 illustrates a memory cell 1701 using a stacked oxide system according to various embodiments. The cell includes the two electrodes 1703 and 1705, as well as a semiconductor device layer (including a first region 1707 in which additional defects are created, and a second region 1709). The first region may be a transition metal oxide with a bandgap greater than 4 eV such as hafnium oxide, aluminum oxide, titanium oxide, niobium oxide, tantalum oxide or other materials, fabricated according to the processes described herein. The second region may be the same material, or if desired, a different material, such as scandium oxide, yttrium oxide, or one of the other doping materials described below. The illustrated three layer system can rely upon ion bombardment to enhance defects in the first region layer 1707, and can use the defect access layer 1711 to increase the effective work function of the electrode 1703. In some embodiments, the same material or materials can be used in both the defect access layer 1711 and the second region 1709.

The memory cell 1701 of FIG. 17 can be fabricated to include an interdiffused region 1713. The interdiffused region can be formed by annealing the memory cell, for example, at 300-1000° Celsius (C) for ten seconds (s) to four hours or more. The annealing causes the migration of charged species within the crystalline structure, thereby stabilizing defects and traps which can be used to form percolation paths.

A. Device Operation

Figure 18:
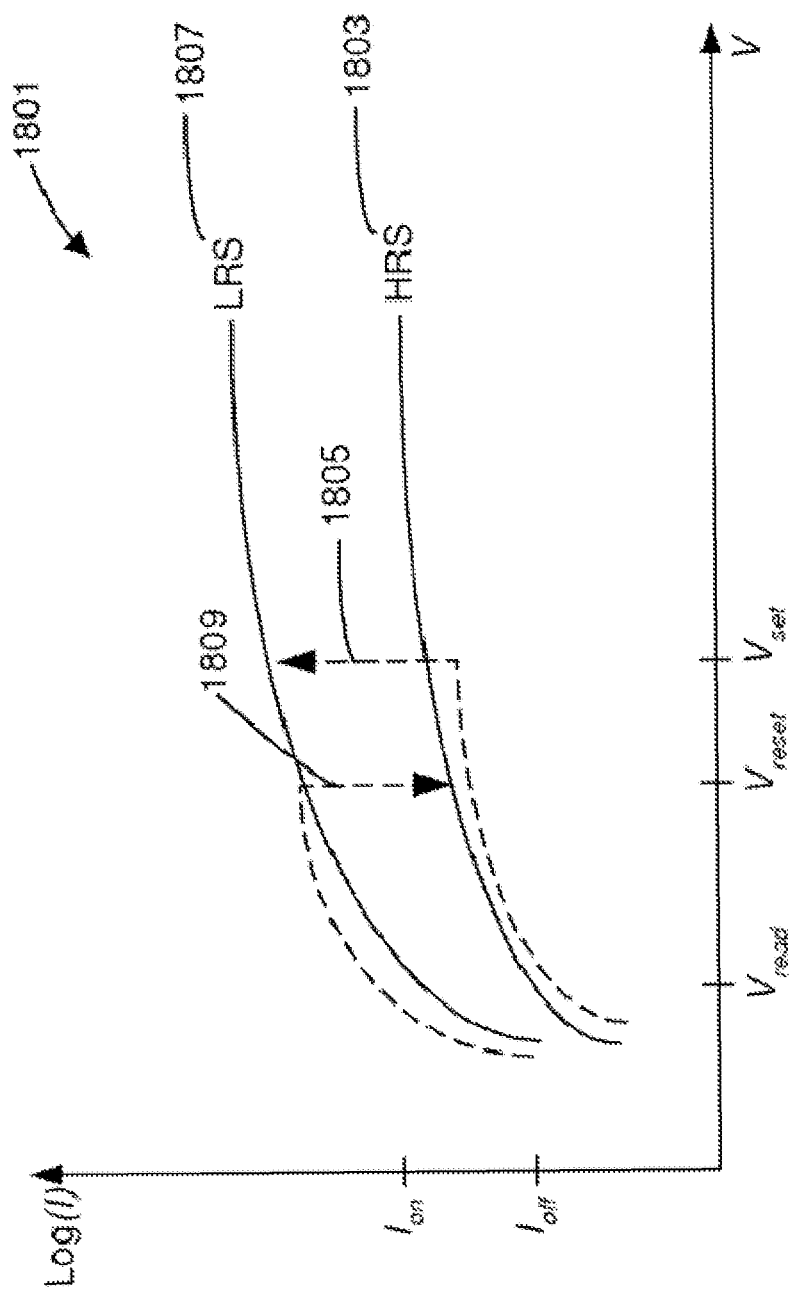
FIG. 18 presents a graph 1801 that plots current versus voltage characteristics of a multistable memory device. In particular.

FIG. 18 is graph 1801 of logarithm of current (I) versus voltage (V) for the memory cell of FIG. 17. FIG. 18 helps illustrate set and reset operations that are relied upon to change the contents of the memory cell. Initially, the cell may be in a high resistance state (denoted by the label "HRS" in FIG. 18, e.g., representing a logic "zero"). The current and voltage characteristics of this state are represented by a first curve 1803 in FIG. 18. This high resistance state may be sensed by read and write circuitry using signal lines (e.g., column and row lines) as was previously described. For example, read and write circuitry may apply a read voltage $V_{read}$ across the cell for the purpose of sensing the resulting "off" current $I_{off}$ that flows through the cell and its semiconductor device layers. When it is desired to store a logic "one," the cell can be placed into its low resistance state by using read and write circuitry to apply a set voltage $V_{set}$ across the signal lines. The set voltage is typically greater than the read voltage and causes the cell to transition to its low resistance state, as indicated by dashed line 1805 and by the acronym "LRS;" the voltage and current characteristics of this state are denoted by a second curve 1807. As mentioned, the change in the resistive state may be effectuated by reason of the filling of traps (i.e., a may be "trap-mediated") in a metal oxide material.

As with the high resistance state, the low resistance state "LRS" of the cell can also be sensed using the read and write circuitry. When a "read" voltage $V_{read}$ is applied to the cell, read and write circuitry will sense the magnitude of the current flow which, given the relatively lower resistance, will be higher than magnitude of the "off" current. The magnitude of this "on" current $I_{on}$ indicates that the cell is in its low resistance state. When it is desired to store a logic "zero" in the cell, a reset voltage $V_{reset}$ is placed across the cell to change its resistance state back the high resistance state HRS, as indicated by dashed line 809. The reset voltage is typically also greater than the "read" voltage and, in at least one embodiment, may be made to be of opposite polarity with respect to the set voltage. Voltage pulses of appropriate amplitude and duration (see FIG. 17) can be used for purposes of the operations just described.

Figure 19:
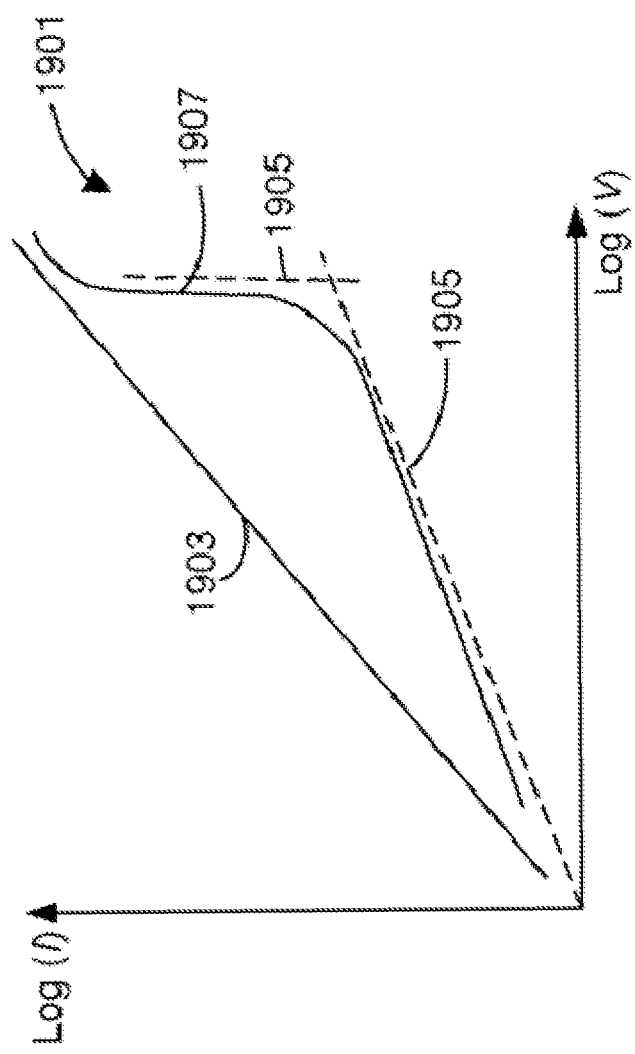
FIG. 19 presents a graph 1901 that shows current versus voltage characteristics for multistable memory cells.

FIG. 19 presents a graph 1901 of the logarithm of current (I) versus log of voltage (V) for a bistable memory cell. A straight line 1903 represents the response of an Ohmic material when the ramped voltage is applied. An Ohmic response is undesirable, since there is no discrete voltage at which a state change (set or reset) occurs. Such a change is graphically represented by a set of two intersecting, dashed lines 1905, with an abrupt change in current response occurring at a specific voltage. In practice, an appropriate response might follow a curve indicated by reference numeral 1907, where the discontinuity (rapid increase in current) occurs at a set voltage, where the bistable cell switches from the high resistance state to the low resistance state.

The multistable resistance characteristic just described makes the memory cell suitable for storing digital data. Because data may be reliably stored in the absence of application of the described voltages, the cell may be considered nonvolatile. As mentioned previously, it is desirable for the cell to have a large difference between "off" current and "on" current (e.g., a relatively high $I_{on}/I_{off}$ ratio), which renders the states of the cell more easily detectable.

In the discussion below, additional information will be presented concerning the multistable materials just described and the mechanisms believed to be associated with state change.

1. Switching Mechanisms

As indicated above, a basic MIM structure includes two electrodes and a semiconductor device layer sandwiched in between the electrodes. The semiconductor device layer typically will include a metal oxide layer that includes an oxide of at least one metal and that that blends together the metal, metal oxide and oxygen with unknown, potentially complex bonding characteristics. The term "MIM" as used herein should be understood to potentially include other layers, and to encompass metal-insulator-insulator-metal, metal-insulator-insulator-insulator-metal, metal-insulator-metal-insulator-metal and other, similar structures, including structures with other enhancement layers between them (e.g., to promote adherence of other layers).

Without being bound by theory, it is believed that the multistable structure described above uses a switching mechanism that is at least partially mediated in the bulk of the metal oxide layer. In one embodiment, the switching mechanism uses non-metallic conductive paths rather than filamentary or metallic conductive paths. Generally, defects are formed in the deposited metal oxide or can be enhanced by additional processes. Defects may take the form of states with energies within the bandgap of the metal oxide, allowing greater conductivity through the sample by providing the charge carriers a stepwise path through the barrier otherwise presented by the insulating or semiconducting layer. These defects may also be, depending on material, created or enhanced at the boundary of a metal oxide layer and another layer within the MIM structure. By applying a voltage to the multistable structure introduced above, the defects, such as traps, can either be filled or emptied to alter the resistivity of each cell. The switching mechanisms form percolation paths through the bulk of the metal oxide which may be formed during a set operation and broken during a reset operation.

For example, in a multistable structure, during a set operation, the memory cell switches to a lower resistance state. The percolation paths that are formed by filling traps increase the conductivity of the metal oxide, thereby reducing (i.e., changing) the resistivity. At this voltage, traps are filled and there is a large jump in current as the resistivity of the metal oxide decreases.

As described above in conjunction with FIG. 15, the percolation paths can be described as non-metallic. With metallic materials, resistivity decreases with lower temperature. The multistable structures described herein demonstrate an increase in resistance with decreases in operating temperatures, a conclusion further supported by FIG. 20.

Figure 20:
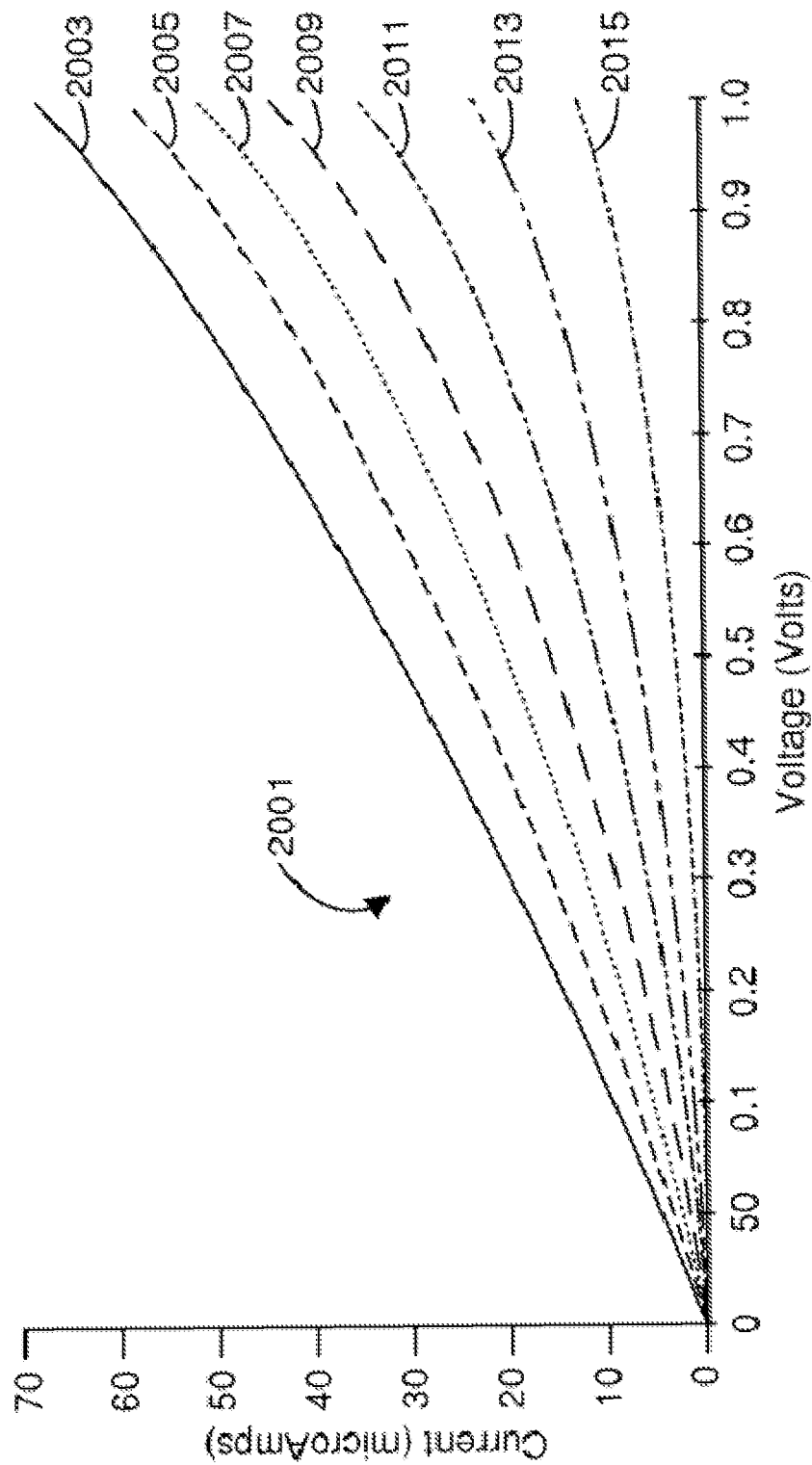
FIG. 20 is a graph 2001 that shows a number of curves 2003, 2005, 2007, 2009, 2011, 2013 and 2015; the curves are used to illustrate behavior of metal oxides as, effectively, non-metallic substances.

FIG. 20 provides a graph 2001 that illustrates a non-metallic nature of metal oxides used for the memory cells described herein. The graph 2001 shows increasing resistivity for a high-bandgap (i.e., greater than 4 eV) oxide layer with decreasing temperatures, which is a characteristic of a non-metallic material. The graph 2001 shows a sweep in voltage on the x-axis versus current on the y-axis. As seen in FIG. 20, the measurements 2003 taken at a three-hundred Kelvin (300K) level show the greatest current output, and thus lowest resistivity. Measurements taken at 250K, 150K, 100K, 60K, 350K, and 10K, denoted by numerals 2005, 2007, 2009, 2011, 2013 and 2015, respectively, show increasing resistivity (i.e., lower current) as the temperature decreases. Some embodiments described herein therefore include metal oxides that exhibit non-metallic switching mechanisms.

2. Scaling and Bandgap

Figure 21:
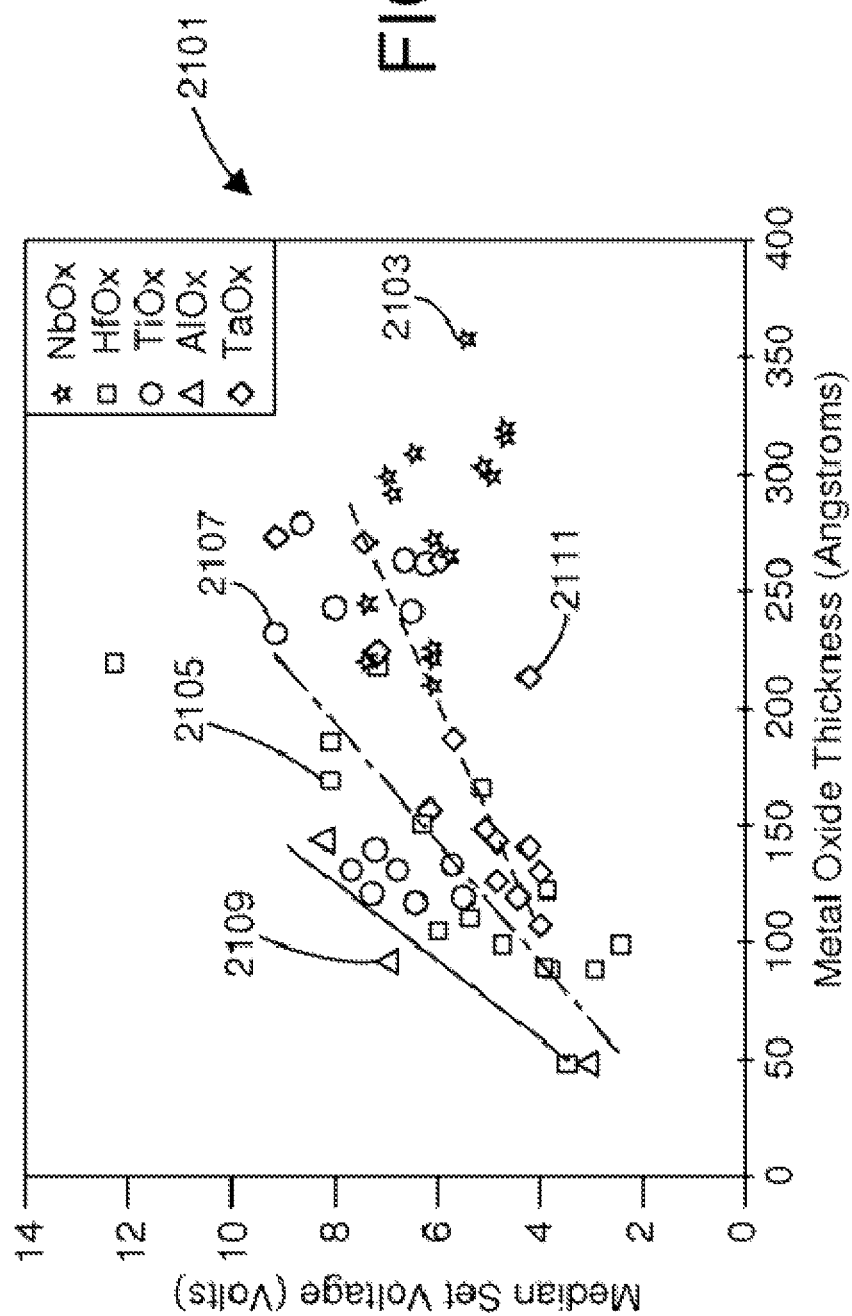
FIG. 21 presents a graph 2101 showing the relationship between thickness of a metal oxide layer and median set voltage for multistable memory device. Different types of points are represented by different shapes 2103, 2105, 2107, 2109 and 2111. Each set of points is associated with a different type of metal oxide usable for the semiconductor device layer of a multistable memory cell.
Figure 22:
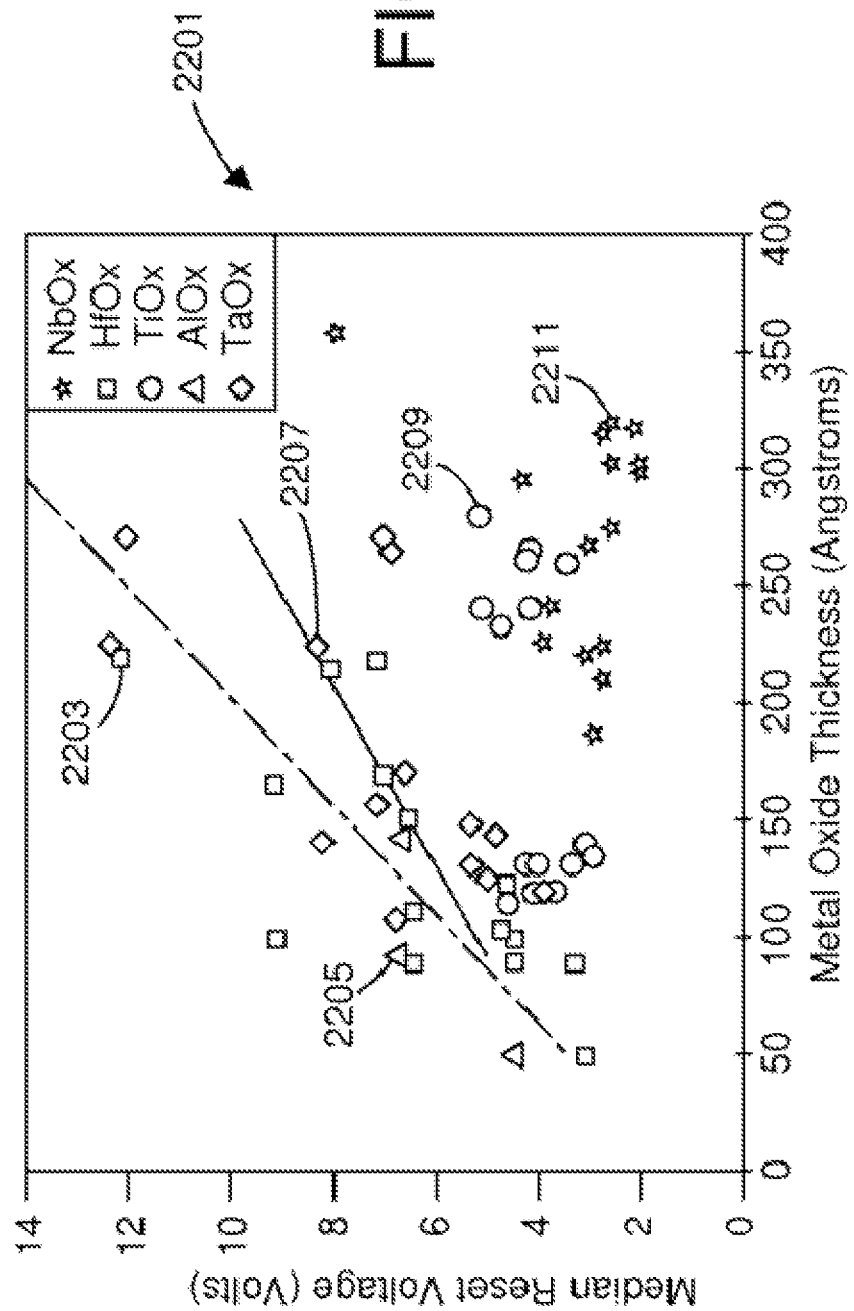
FIG. 22 presents a graph 2201 showing the relationship between thickness of a metal oxide layer and median reset voltage for multistable memory device. Different types of points are represented by different shapes 2203, 2205, 2207, 2209 and 2211. Each set of points is associated with a different type of metal oxide usable for the semiconductor device layer of a multistable memory cell. Again, it is believed that this data both shows that resistive-switching mechanisms are non-metallic, and that these resistive-switching mechanisms are at least partially rooted at the interface between the semiconductor device layer (e.g., the metallic oxide layer) and an adjacent layer (e.g., an electrode).

FIGS. 21 and 22 show the relationship between thicknesses of a metal oxide layer and resulting set voltages and reset voltages. These graphs represent data for a system that includes two electrodes and a single layer of metal oxide disposed in between. FIG. 21 provides a chart 2101 that identifies median set voltage (in Volts) as a function of metal oxide thickness in Angstroms, again for oxides of niobium (2103), hafnium (2105), titanium (2107), aluminum (2109) and tantalum (2111). As can be seen in FIG. 21, for hafnium oxide 2105, aluminum oxide 2109, and tantalum oxide 2111, set voltage increases with (i.e., appears to be dependent on) thickness. In some embodiments, depending on materials used, the set voltage is at least one volt (V) per one hundred angstroms (Å) of the thickness of a metal oxide layer in the memory cell. Also in some embodiments, increases in the thickness of the metal oxide layer of 100 Å increase the set voltage by at least 1 V. Similarly, as shown in FIG. 22, reset voltage for hafnium oxide 2203, aluminum oxide 2205, and tantalum oxide 2207 also depends on thickness. These data therefore support a set/reset mechanism that is at least partly dependent upon bulk for these materials, since FIGS. 21 and 22 indicate a generally linear relationship between both set voltage and thickness and reset voltage and thickness, at least for a range of layer thickness—such a relationship in turn indicates the formation of percolation paths in the bulk of the metal oxide. In other words, for a thicker material, more voltage is needed to fill the traps.

As noted earlier and also born out in connection with FIGS. 21 and 22, the set and reset voltages for niobium oxide and titanium oxide appear to be independent of layer thickness (see, e.g., numerals 2109 and 2111 in FIG. 21). Each of these materials is a relatively low bandgap material, i.e., having a bandgap of less than 4 eV. Therefore, a higher bandgap (i.e., bandgap greater than 4 eV) metal oxide exhibits switching and scalable set and reset voltages that are relatively more dependent on bulk. In other words, set voltage and reset voltage can be reduced by reducing the thickness of the high bandgap metal oxides such as hafnium oxide. Therefore, for smaller devices based on these materials, set and reset voltages can be lowered.

B. Additional Materials Considerations

For the structures discussed above, a wide variety of materials are suitable for use in (a) the semiconductor device layer (e.g., metal oxide layer), (b) one of the electrodes in a MIM stack, or (c) as one or additional layers or structures used with a MIM stack. For example, design considerations may include using more than one metal oxide in a single layer (co-deposition) or multiple layers (stacked), using electrodes that have different work functions, using at least one noble metal electrode, using different metal oxides having different bandgaps, and using low leakage materials.

1. Metal Oxides (One or More Layers)

Specific base metallic oxides that demonstrate appropriate switching mechanisms include hafnium oxide, vanadium oxide, scandium oxide, aluminum oxide, tantalum oxide, zirconium oxide, and yttrium oxide. These metal oxides have a bandgap that is greater than 4 eV, indicating that they are more insulating and therefore have a higher resistivity. As explained above, the use of high bandgap (i.e., greater than 4 eV) metal oxides also allow for at least partial scaling of set voltage as related to metal oxide thickness.

These various metals and metal oxides may also be further doped with each other. Other dopants may include oxygen, silicon, silicon oxide, nitrogen, fluorine, chromium, and chromium oxide, as well as rare earth metals such as lanthanum, cerium, praseodymium, neodymium, gadolinium, erbium, ytterbium, and lutetium and their oxides, any of which may be used for ion bombardment processes, per the teachings presented above.

Dopants can be selected by considering probable oxidation states with the potential to create defects. For example, hafnium atoms can have a +4 ($Hf^{+4}$) oxidation state, and aluminum atoms can have a +3 ($Al^{+3}$) oxidation state. Aluminum oxide can be doped into hafnium oxide, creating charge imbalances by creating substitution defects where aluminum atoms replace hafnium atoms (i.e., $Al_{Hf}^{1-}$), and vice versa (i.e., $Hf_{Al}^{1+}$). These defects allow for the formation of percolation paths in the bulk of the metal oxide.

Another criterion for selecting dopants can be the difference between the valence (e.g., for a p-type dopant) or conduction (e.g., for an n-type dopant) band of the dopant and the valence or conduction band of the metal oxide. In some embodiments, a difference between the valence bands that is greater than 50 meV can provide deep-level dopants that can form deeper and more accessible traps in the bulk.

As alluded-to in connection with the examples presented earlier, doping and bombardment can be performed using the same metal as the metal oxide into which the dopant is injected. For example, a hafnium oxide layer can be doped with hafnium ions. Doping can be performed using implantation, for example. Implantation energy may generally be in the range of 0.5 keV to 55.0 keV depending on the ion being implanted and the thickness of the metal oxide and the desired defect generation. This doping can improve memory cell yield. These layers can also be thermally treated by, for example, rapid thermal anneal (RTA), rapid thermal oxidation (RTO) or a forming gas anneal. The thermal treatment can modify defects via a variety of effects, such as interdiffusion of defect species between the materials, thermally induced interfacial stress generation of defects, annealing out of undesirable defects, and/or modification of existing defects and their environments, creating localized defect states which can serve as trap states. Alternatively, as mentioned earlier, other forms of ions can be used, including non-metal ions such as oxygen.

If desired for the particular implementation, a metal oxide can be positioned adjacent to a metal nitride electrode, with a common metal used to form both materials. For example, a memory cell can be formed having a titanium nitride electrode and a titanium oxide layer adjacent to the titanium nitride electrode. This structure may serve to stabilize the interface and promote adherence of other layers, for example. The memory cell can also include other metal oxides (e.g., aluminum oxide or hafnium oxide) in a stacked or co-deposited manner.

In still further embodiments, multiple oxides can be combined together in discrete layers to adjust the current flow characteristics of the memory cell. One layer consisting predominantly of a one metal oxide (or one combination of oxide, oxides or metals) can have a smaller "on" current than the second layer formed of a different combination or to have different current flow characteristics.

2. Electrodes

Electrode materials may include silicon, silicides, titanium nitride (TiN), nickel, platinum, iridium, iridium oxide, ruthenium and ruthenium oxide. According to some embodiments, one electrode may be a higher work function material, and the other electrode may be a lower work function material. For example, in one embodiment, at least one electrode is a high work function material such as a noble or near noble metal (i.e., a metal with a low absolute value free energy change (IAGI) of oxide formation). Noble or near noble metals include iridium, iridium oxide, platinum, ruthenium, and ruthenium oxide. The other electrode may be a lower work function material such as titanium nitride, or may also be a noble or near noble material. In some embodiments, the reset voltage at the electrode having the higher work function may be applied as a positive polarity pulse (i.e., the higher work function electrode is the anode of the memory cell). The electrodes can also be multi-layer electrodes that can include one or more different materials. For example, an electrode can include a layer of ruthenium and ruthenium oxide, or a layer of iridium, iridium oxide, or platinum with a capping layer of tungsten, tungsten carbonitride, or tungsten carbon. The multi-layer electrodes can be used to improve adhesion properties and performance of memory cells in some configurations and embodiments.

3. Other Layers

The insulator or semiconductor device layer of the MIM stack can also be constructed using multiple layers of oxides. The combination of oxides can be used to impart desired characteristics to memory cells. Other layers may also be used, such as for example, a defect access layer as described below. Each such layer is optional, and may or may not be pertinent to a particular implementation. As mentioned earlier, the stack may also optionally include another electrical device such as an embedded transistor or diode (referred to below as a "current steering element"). The various layers for these memory cells can be deposited using any appropriate technique including dry (CVD, ALD, PVD, PLD, evaporation) and wet (liquid chemical e.g., ELD, ECD) techniques. Combinations of these techniques can also be used. For example, one layer can be deposited using PVD and another deposited using ALD.

The operation of memory cells that include multiple metallic oxide layers is generally the same as that described above for a cell having a single metal oxide layer. For example, the set and reset pulses and percolation paths described above apply equally to both single layer metal oxide embodiments and multiple layer metallic oxide embodiments. Generally speaking, oxide stacks can be used to impart desired characteristics to a memory cell. For example, a defect access layer can increase the effective work function of an adjacent electrode, thereby any requirement that the electrode also have a high work function. In some instances, stacking oxides can improve set and reset voltage distribution and also facilitate better memory cell yield.

A defect access layer can be configured as a layer between the one of the electrodes (generally the anode) and the semiconductor device layer. The defect access layer is a thin layer (i.e., 25% as thick as the semiconductor device layer or less) that allows the electrode to better access the defects while in some embodiments reducing currents because of the increased resistivity of the defect access layer. In some embodiments, one electrode has a higher work function than the other electrode; in these embodiments, the defect access layer may be placed adjacent to the high work function electrode. The defect access layer can increase the effective work function of the adjacent electrode, thereby allowing the use of less noble or non-noble electrodes. Additionally, depending on the materials chosen, the electrode may show better adhesion to the defect access layer than the metal oxide of the base layer. Therefore, the defect access layer can be used in materials systems as an adherence layer to promote physical integrity of the memory cell. In another embodiment, the defect access layer can be a thin (e.g., less than 50 Å or less than 20 Å) stable oxide such as aluminum oxide, to facilitate use of non-noble electrodes as a higher work function electrode.

To provide a further example of materials that may be used, in one embodiment, titanium nitride, silicon, silicide, or a noble metal can be used for one electrode, hafnium oxide can be used as the primary constituent of the base layer, aluminum oxide can be used as a doping layer, and a noble or near-noble metal such as platinum, iridium, iridium oxide, ruthenium, or ruthenium oxide can be used for a second electrode. In such a system, additional defects may be created by ion bombardment as described earlier, and interdiffusion or aliovalently doping may also be used to enhance the doping layer. The different oxidation states of the metallic oxide, e.g., hafnium create traps, which mediates the switching mechanism.

In a second example, the base layer can be any transition metal oxide having a bandgap greater than 4 eV, a set voltage of greater than 1 V per 100 Å of thickness, and a leakage current density less than 40 Amps/cm$^2$ at 0.5 V per 20 Å of metal oxide in the "off" state. Examples include hafnium oxide, aluminum oxide, tantalum oxide, and zirconium oxide. The other layers can also be formed from transition metal oxides, such as titanium oxide or niobium oxide, or from materials that exhibit high resistivity or other desirable characteristics. Some other examples include stacks that blend (a) titanium oxide, hafnium oxide and titanium oxide layers, (b) hafnium oxide and yttrium oxide layers, or (c) yttrium oxide and hafnium oxide layers.

As alluded-to earlier, other electrical components may also be associated with each memory cell. Current steering elements may include, for example, diodes, p-i-n diodes, silicon diodes, silicon p-i-n diodes, transistors, etc. Current steering elements may be connected in series in any suitable location within or adjacent to the memory cell, including in between one of the electrodes and the remainder of a cell or oxide stack, referenced above. Current steering elements may be used to enhance operation or control of memory cells (or other semiconductor structures), depending on the application.

VI. Conclusion

A method of fabricating a semiconductor device layer and associated memory cell structures have been described above, each usable with a wide variety of material options. By performing a surface treatment process to create defects in a semiconductor device layer, with the depth and concentration of defects controlled (for example, through an ion bombardment process), one may create a semiconductor device layer and associated memory cells having more consistent electrical parameters. For example, using the techniques disclosed above, one may reduce the voltage and current needed to condition and operate the structures described above. Thus, the teachings provided above provide for greater yield, reliability and more predictable operation.

Embodiments presented above have referenced specific materials and interrelationships between layers, including metallic oxides such as niobium oxide, hafnium oxide, titanium oxide, aluminum oxide and tantalum oxide. These oxides may be bombarded by ions that are metallic or non-metallic, for example, using oxygen ions as described above. Oxide layers may also be bombarded by metal ions of the same species as represented by the metallic oxide being bombarded. However, as mentioned, these materials and interrelationships are exemplary only and, as mentioned, a wide variety of materials may be used in place of the mentioned species, as no doubt will occur to those having skill in semiconductor fabrication or materials engineering.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

The invention claimed is:

1. A method of fabricating a multistable resistive memory device, the method comprising:
    providing a substrate comprising a bottom electrode;
    forming a semiconductor layer over the bottom electrode;
    performing a surface treatment of the semiconductor layer,
        wherein the surface treatment creates defects in an upper region of the semiconductor layer allowing the semiconductor layer to switch between multiple resistive states;
    forming a top electrode over the semiconductor layer with the treated surface; and
    applying a forming voltage between the top electrode and the bottom electrode,
        wherein the applying the forming voltage sets percolation paths within the semiconductor layer.

2. The method of claim 1, wherein the surface treatment comprises implanting ions into the semiconductor layer.

3. The method of claim 2, wherein ion implantation energy used for the surface treatment is between about 0.5 keV and 55 keV.

4. The method of claim 2, wherein the implanted ions comprise metal ions.

5. The method of claim 4, wherein the implanted ions comprise hafnium ions.

6. The method of claim 2, wherein the implanted ions comprise non-metal ions.

7. The method of claim 6, wherein the implanted ions comprise oxygen ions.

8. The method of claim 1, wherein a lower region of the semiconductor layer facing the bottom electrode remains substantially unaltered after performing the surface treatment.

9. The method of claim 8, wherein the lower region occupies at least a half of the thickness of the semiconductor layer.

10. The method of claim 8, wherein an upper region altered by the surface treatment occupies between 25% to 60% of the thickness of the semiconductor layer.

11. The method of claim 1, wherein the surface treatment comprises altering a lattice structure of the semiconductor layer in an upper region of the semiconductor layer.

12. The method of claim 1, wherein applying the forming voltage comprises one or more of rapid thermal annealing, rapid thermal oxidation, or forming gas annealing.

13. The method of claim 1, wherein the bottom electrode comprises one of titanium nitride, copper, nickel, silicide, or polysilicon.

14. The method of claim 1, wherein the substrate comprises a current steering element.

15. The method of claim 1, wherein the semiconductor layer has a thickness of between 150-350 Angstroms.

16. The method of claim 1, wherein the semiconductor layer comprises one or more of hafnium oxide, aluminum oxide, or titanium oxide.

17. The method of claim 1, wherein the semiconductor layer comprises one or more dopants, the dopants comprises one or more of lanthanum, cerium, praseodymium, neodymium, gadolinium, erbium, ytterbium, lutetium, or oxides thereof.

18. The method of claim 17, wherein the surface treatment comprises introducing the one or more dopants into the semiconductor layer.

19. The method of claim 1, wherein the semiconductor layer comprises hafnium oxide and the defects comprise implanted oxygen ions.

20. A method of fabricating a multistable resistive memory device, the method comprising:
    providing a substrate comprising a bottom electrode;
    forming a semiconductor layer over the bottom electrode, wherein the semiconductor layer comprises hafnium oxide;
    performing a surface treatment of the semiconductor layer, wherein the surface treatment creates defects in an upper region of the semiconductor layer allowing the semiconductor layer to switching between multiple resistive states,
        wherein the defects comprise implanted oxygen ions; and forming a bottom electrode over the semiconductor layer with the treated surface.

* * * * *

UNITED STATES PATENT AND TRADEMARK OFFICE
CERTIFICATE OF CORRECTION

PATENT NO. : 8,465,996 B2  Page 1 of 1
APPLICATION NO. : 13/593116
DATED : June 18, 2013
INVENTOR(S) : Miller et al.

It is certified that error appears in the above-identified patent and that said Letters Patent is hereby corrected as shown below:

On the Title Page

Item (75) "Inventors: Michael Miller, San Jose, CA (US); Prashant Phatak, San Jose, CA (US); Tony Chiang, Campbell, CA (US); Xiyang Chen, San Jose, CA (US); April Schricker, Palo Alto, CA (US); Tanmay Kumar, Milpitas, CA (US)" should read --Inventors: Michael Miller, San Jose, CA (US); Prashant Phatak, San Jose, CA (US); Tony Chiang, Campbell, CA (US); Xiying Chen, San Jose, CA (US); April Schricker, Palo Alto, CA (US); Tanmay Kumar, Milpitas, CA (US)--

Signed and Sealed this
Twenty-fourth Day of June, 2014

Michelle K. Lee
*Deputy Director of the United States Patent and Trademark Office*